(12) United States Patent
Kuo et al.

(10) Patent No.: US 10,879,199 B2
(45) Date of Patent: Dec. 29, 2020

(54) METHOD OF MANUFACTURING SEMICONDUCTOR PACKAGE

(71) Applicant: Taiwan Semiconductor Manufacturing Co., Ltd., Hsinchu (TW)

(72) Inventors: Hung-Jui Kuo, Hsinchu (TW); Hui-Jung Tsai, Hsinchu (TW); Jyun-Siang Peng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 19 days.

(21) Appl. No.: 16/533,791

(22) Filed: Aug. 7, 2019

(65) Prior Publication Data

US 2020/0135673 A1    Apr. 30, 2020

Related U.S. Application Data

(60) Provisional application No. 62/752,363, filed on Oct. 30, 2018.

(51) Int. Cl.
*H01L 23/00* (2006.01)
*H01L 21/56* (2006.01)
(Continued)

(52) U.S. Cl.
CPC ........ *H01L 24/03* (2013.01); *H01L 21/31116* (2013.01); *H01L 21/31138* (2013.01);
(Continued)

(58) Field of Classification Search
CPC . H01L 24/03; H01L 21/76871; H01L 21/565; H01L 21/31116; H01L 24/09; H01L 21/4889; H01L 21/31138; H01L 2224/0231; H01L 2224/02379; H01L 2224/02331; H01L 21/31058; H01L 21/4857; H01L 23/49822; H01L 23/49816; H01L 23/3128; H01L 2221/68359; H01L 2221/68345; H01L 21/6835

See application file for complete search history.

(56) References Cited

U.S. PATENT DOCUMENTS

2017/0250091 A1\* 8/2017 Yu .......................... H01L 24/19

\* cited by examiner

*Primary Examiner* — Kyoung Lee
(74) *Attorney, Agent, or Firm* — JCIPRNET

(57) ABSTRACT

The present disclosure provides a method of fabricating an integrated fan-out package including the following steps. A semiconductor die is laterally encapsulated by an insulating encapsulant. A redistribution circuit structure is formed on the insulating encapsulant and the semiconductor die, and the redistribution circuit structure is electrically connected to the semiconductor die. A forming method of the redistribution circuit structure includes the following steps. A conductive wiring is formed over the insulating encapsulant and the semiconductor die. A dielectric material is formed on the insulating encapsulant and the semiconductor die to cover the conductive wiring. A sacrificial layer is formed on the dielectric material, wherein a first top surface of the sacrificial layer is flatter than a second top surface of the dielectric material. The sacrificial layer and a portion of the dielectric material are removed until the conductive wiring is revealed to form a dielectric layer, wherein the conductive wiring is embedded in the dielectric layer.

20 Claims, 36 Drawing Sheets

(51) Int. Cl.
*H01L 21/768* (2006.01)
*H01L 21/311* (2006.01)
*H01L 21/48* (2006.01)

(52) U.S. Cl.
CPC ........ *H01L 21/4889* (2013.01); *H01L 21/565* (2013.01); *H01L 21/76871* (2013.01); *H01L 24/09* (2013.01); *H01L 2224/0231* (2013.01); *H01L 2224/02331* (2013.01); *H01L 2224/02379* (2013.01)

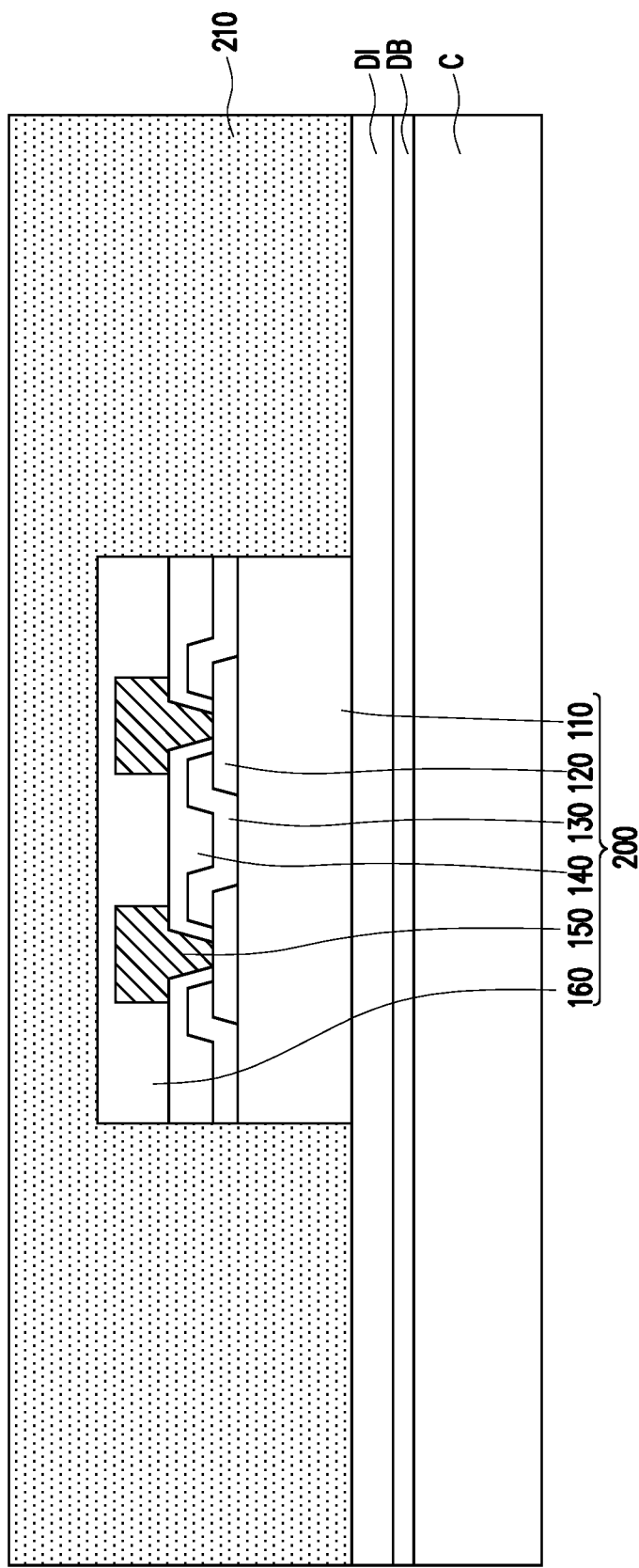

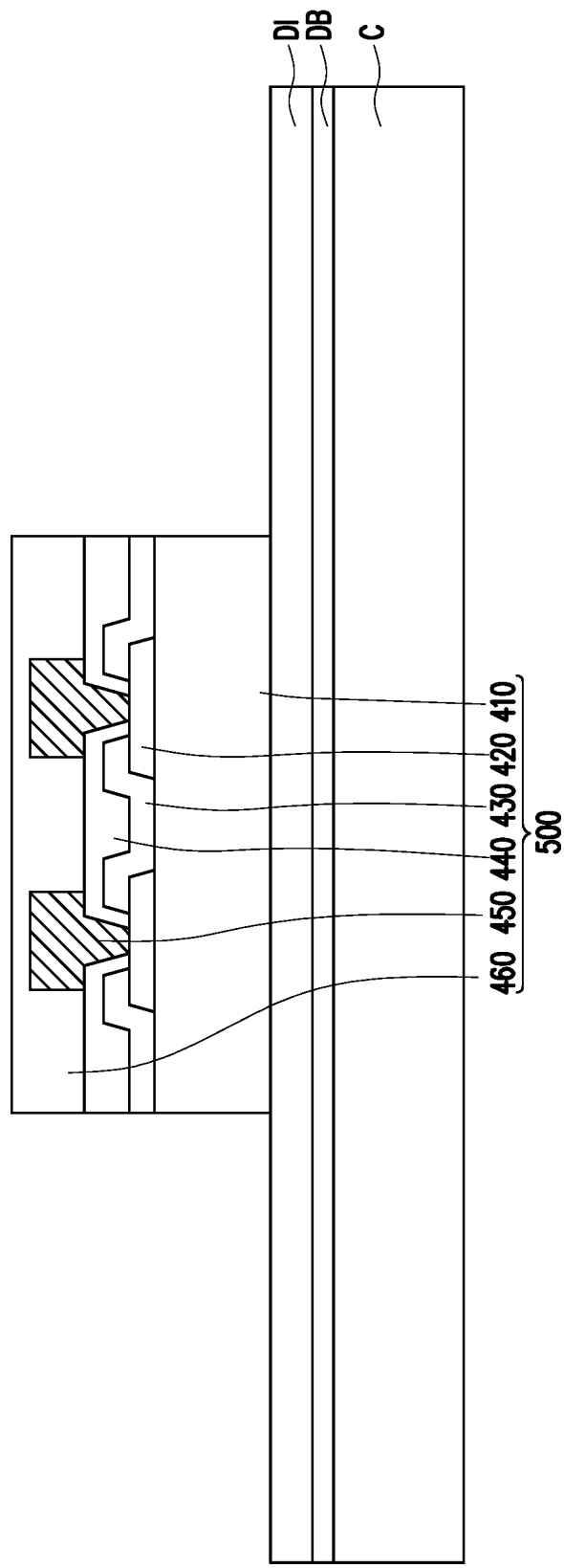

METHOD OF MANUFACTURING SEMICONDUCTOR PACKAGE

CROSS REFERENCE

This application claims the priority benefit of U.S. provisional application Ser. No. 62/752,363, filed on Oct. 30, 2018. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area. With the growing demand for miniaturization, higher speed, greater bandwidth and lower power consumption, there is a need for smaller and more creative packaging for semiconductor dies. For example, integrated fan-out packages have become increasingly popular due to their compactness. However, with the reduction of product size, many problems such as a topographical issue of dielectric layers in a redistribution circuit structure becomes critical. Improved reliability provided by the redistribution circuit structure is one of key factors for future fan-out packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1A:
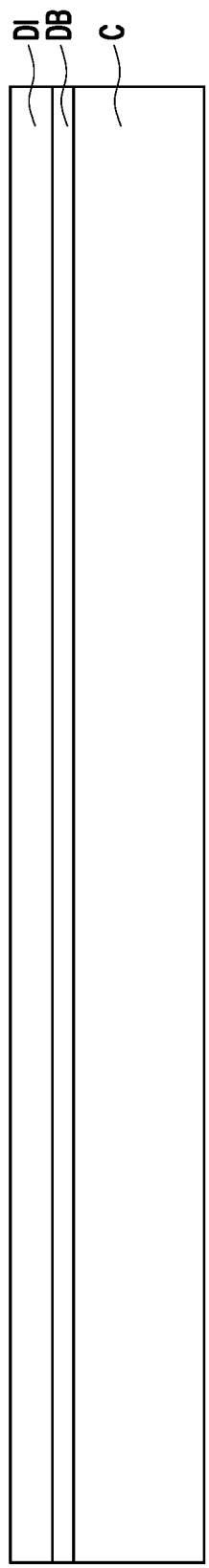
FIGS. 1A through 1Q illustrate a process flow for fabricating an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
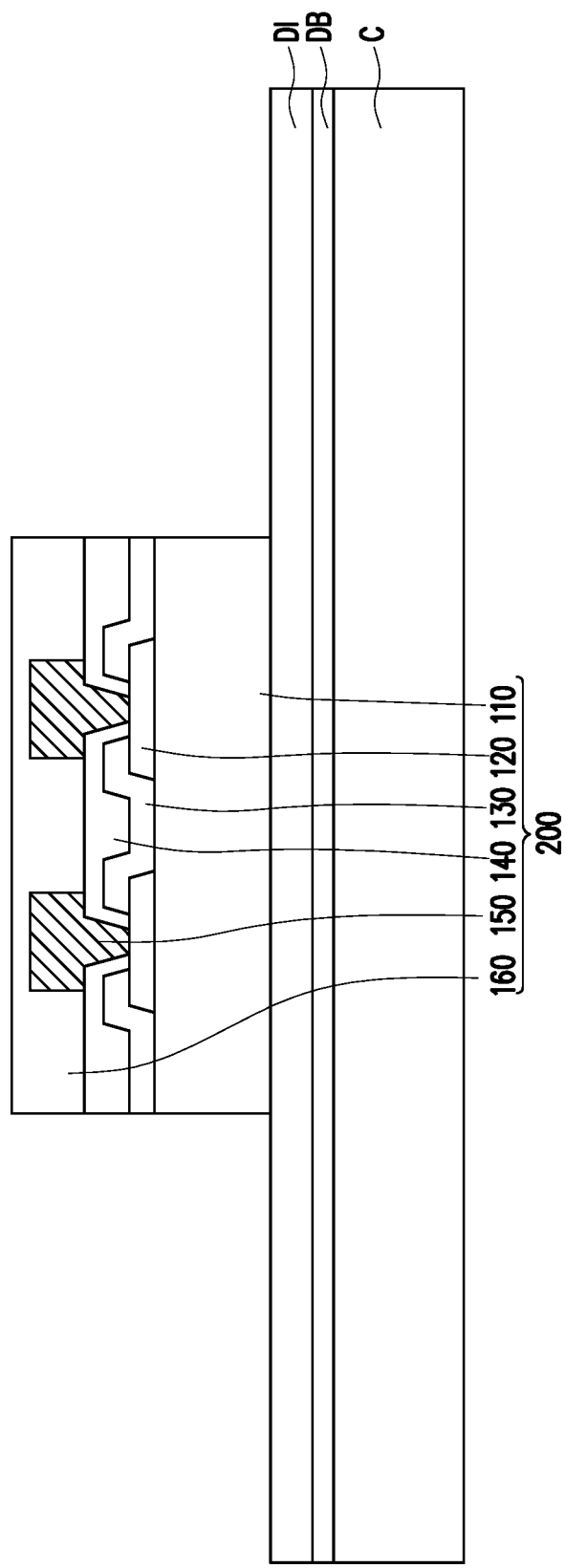
Figure 1D:
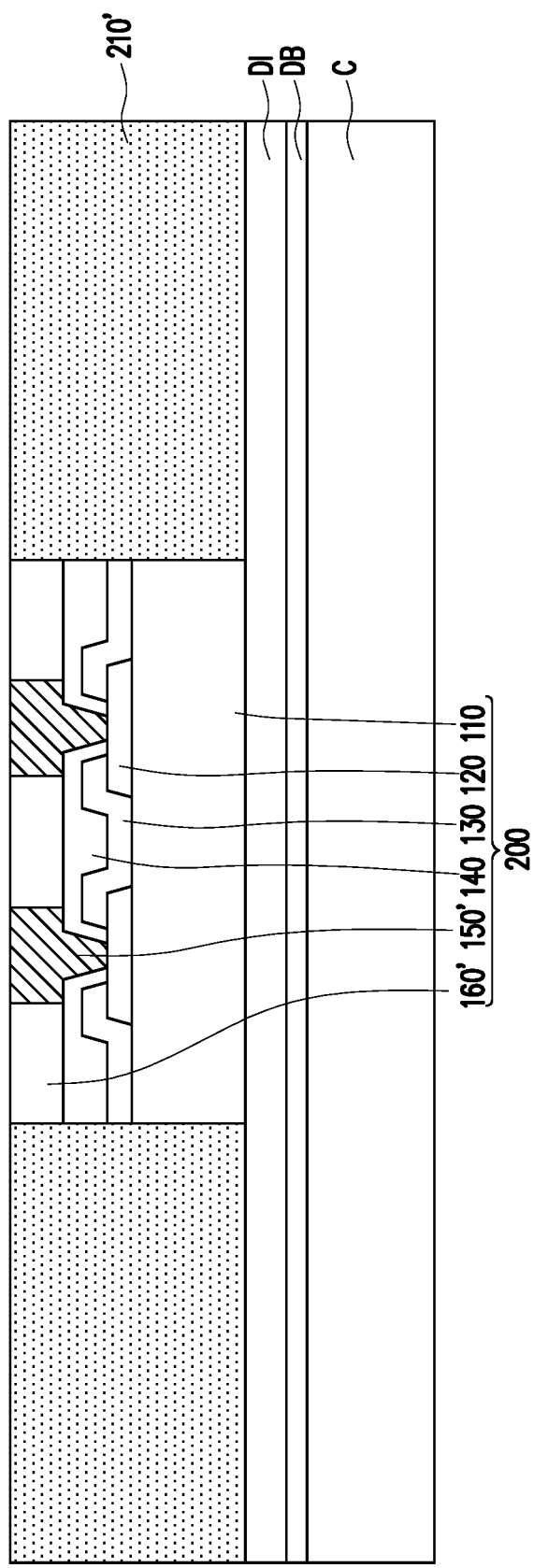
Figure 1E:
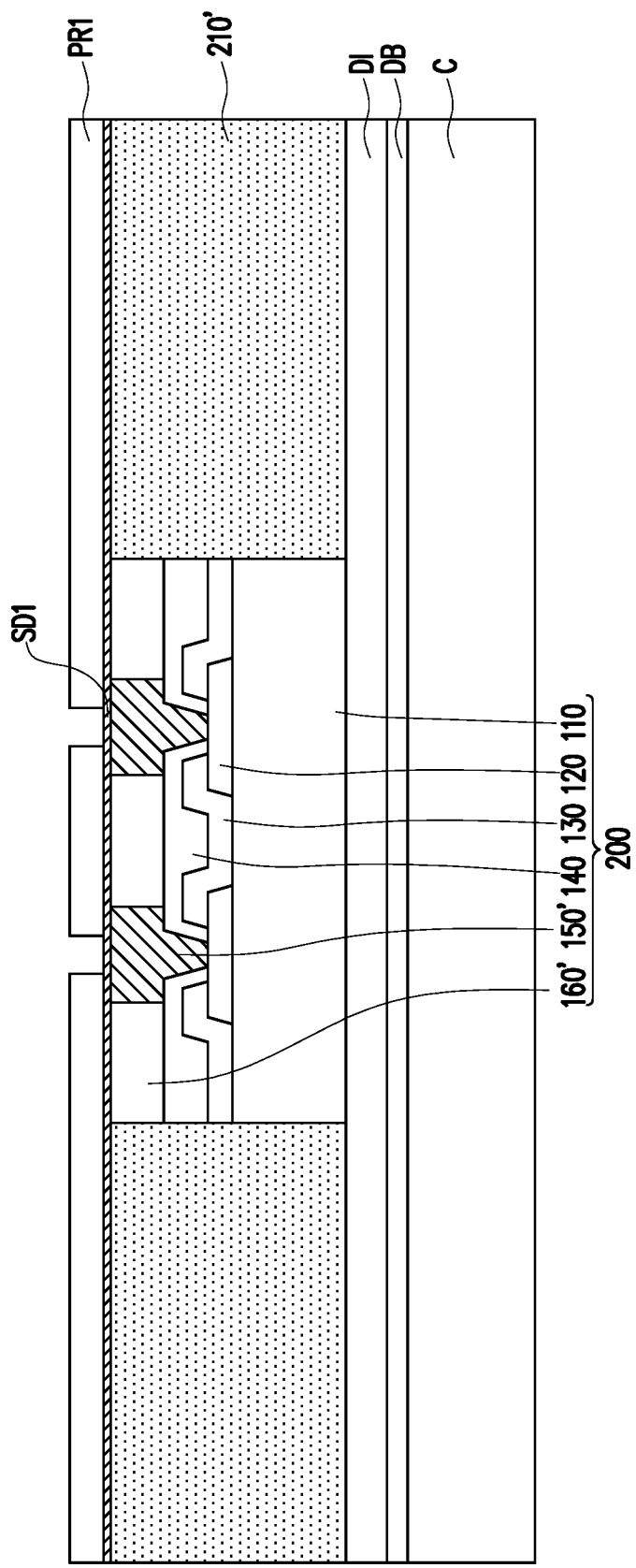
Figure 1F:
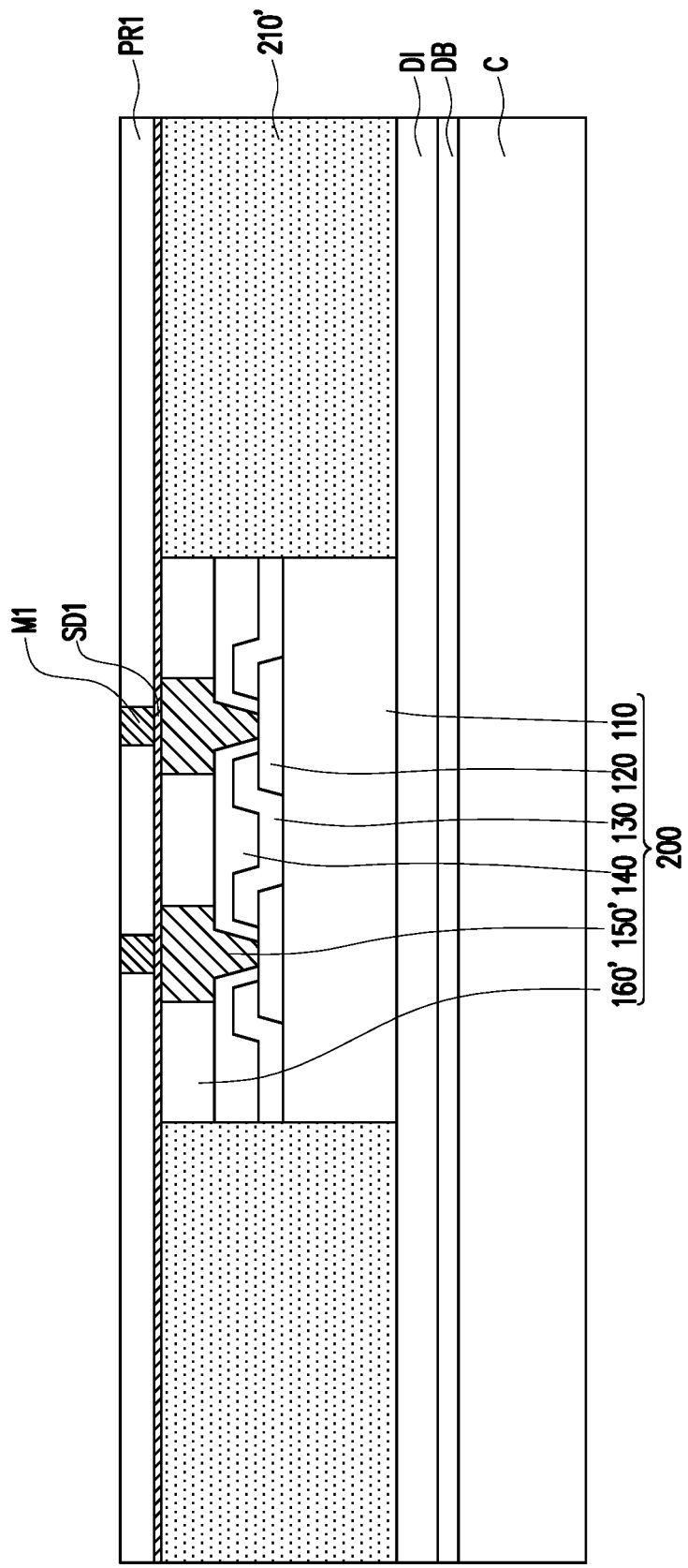
Figure 1G:
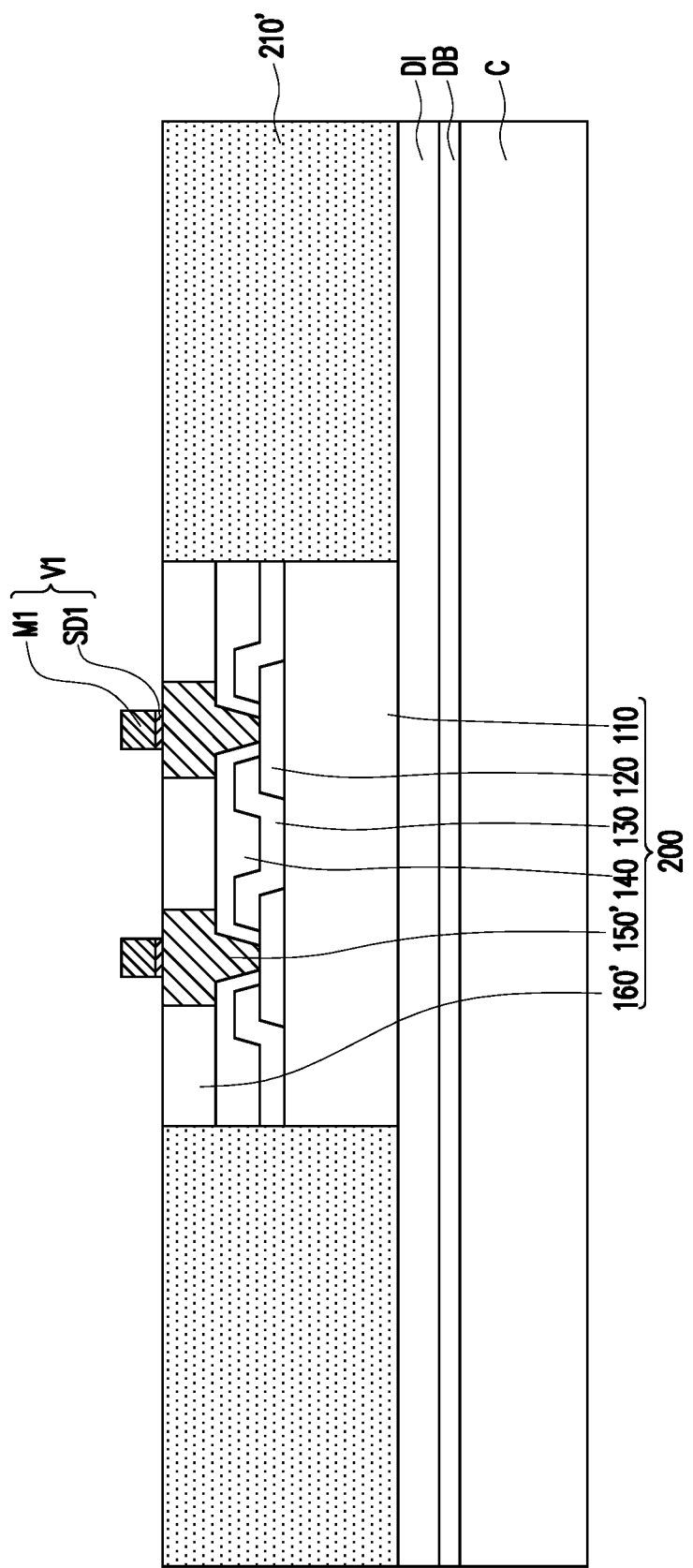
Figure 1H:
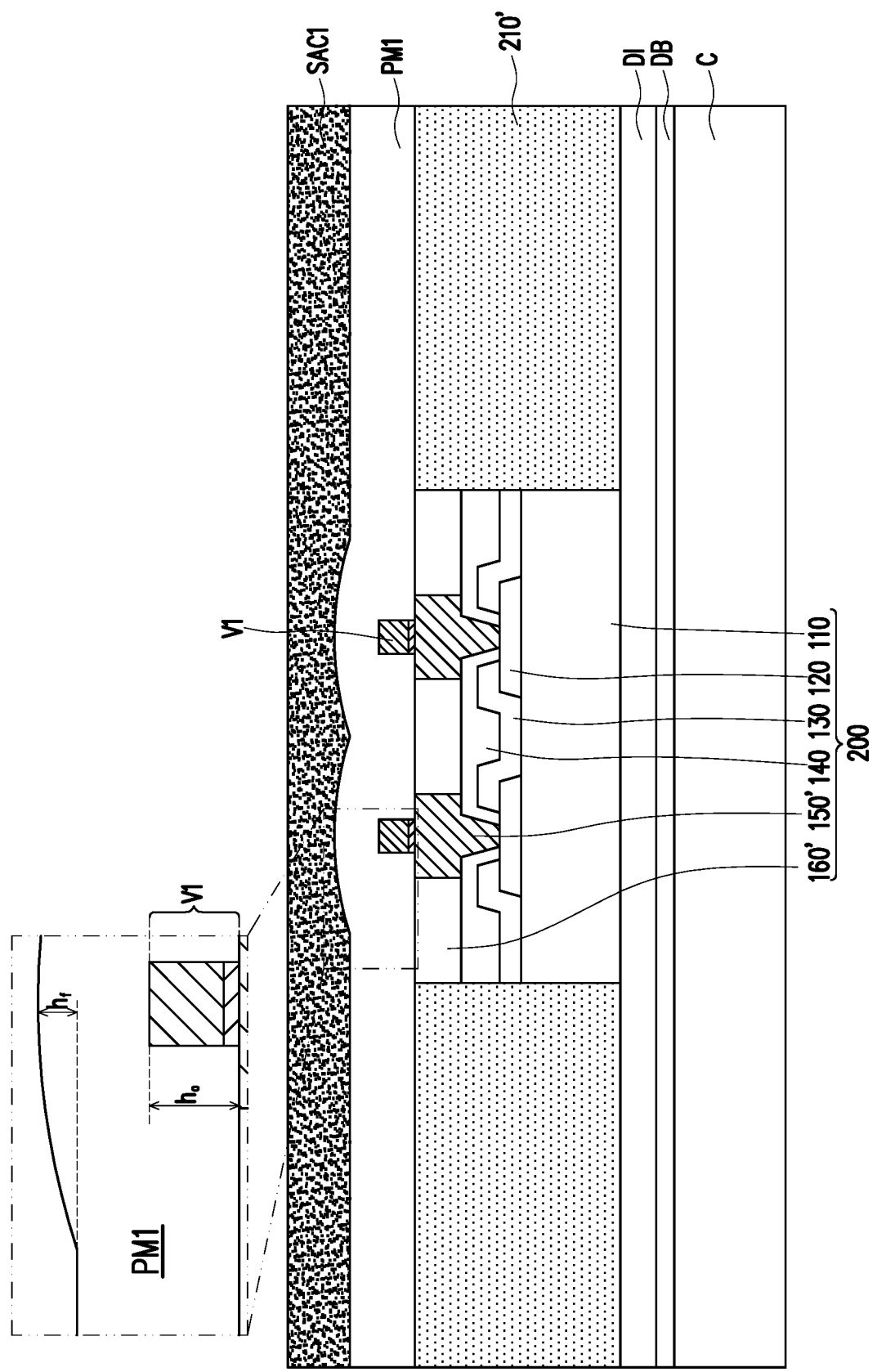
Figure 1I:
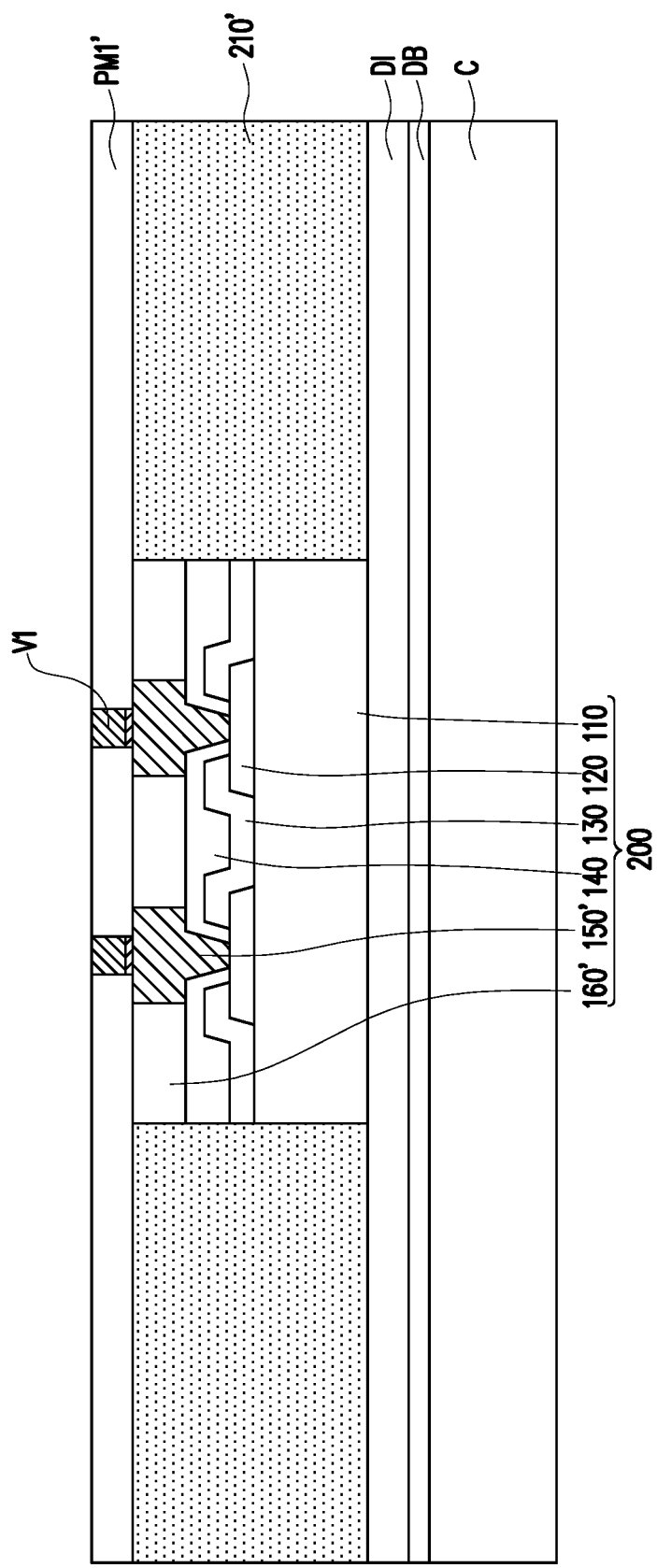
Figure 1J:
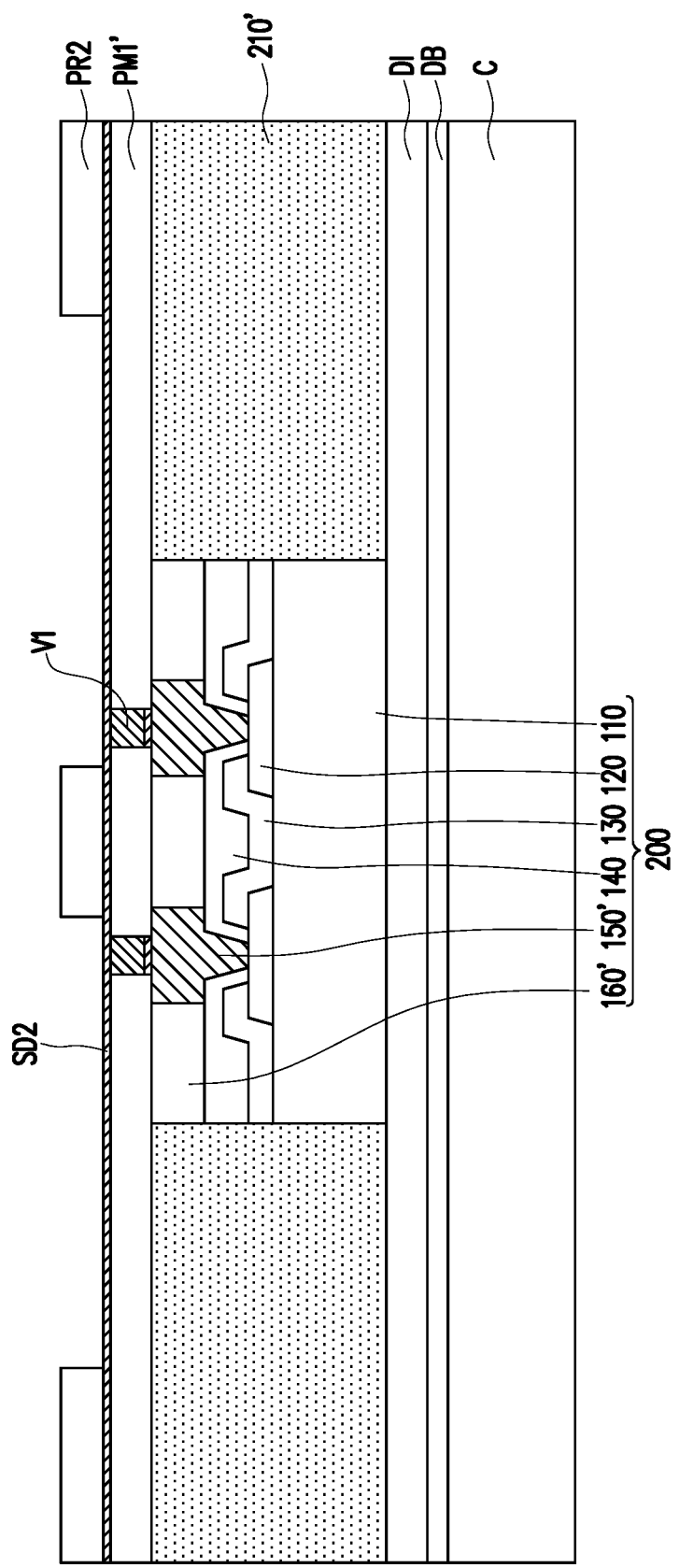
Figure 1K:
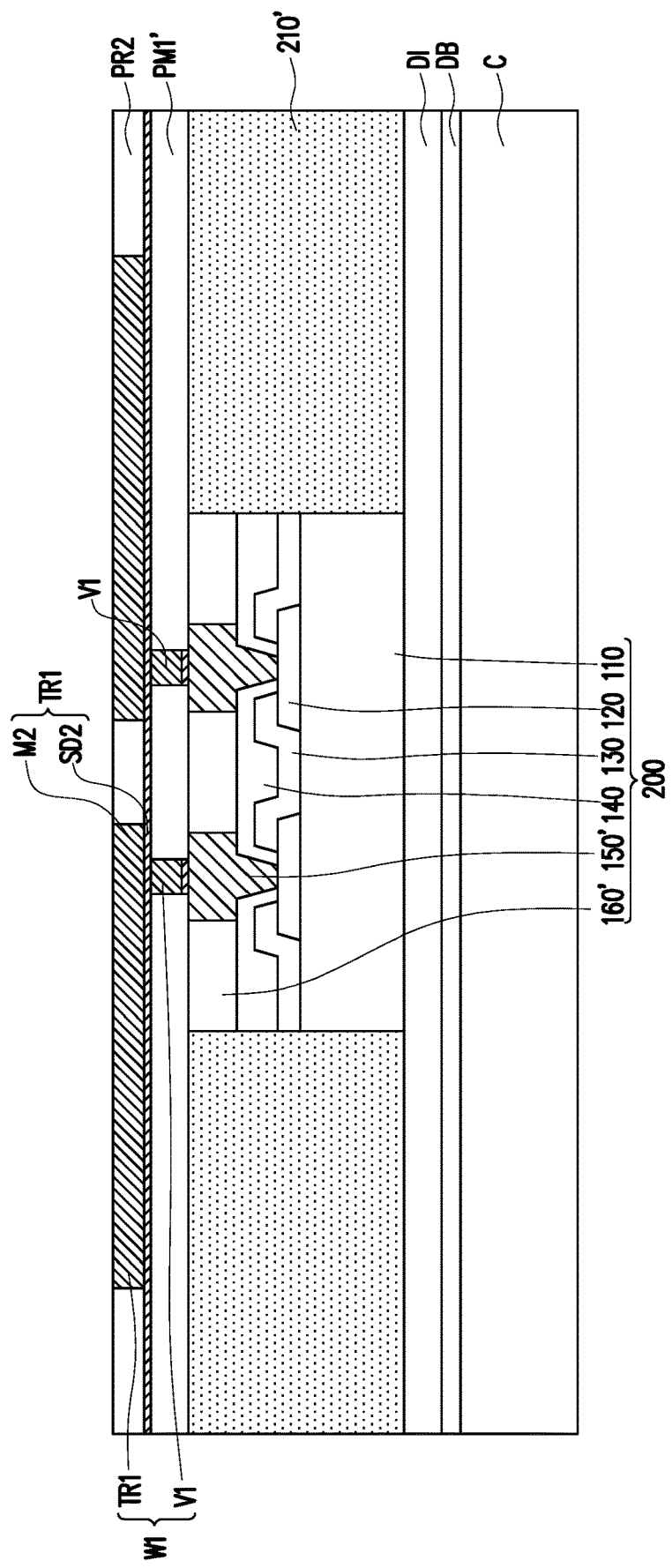
Figure 1L:
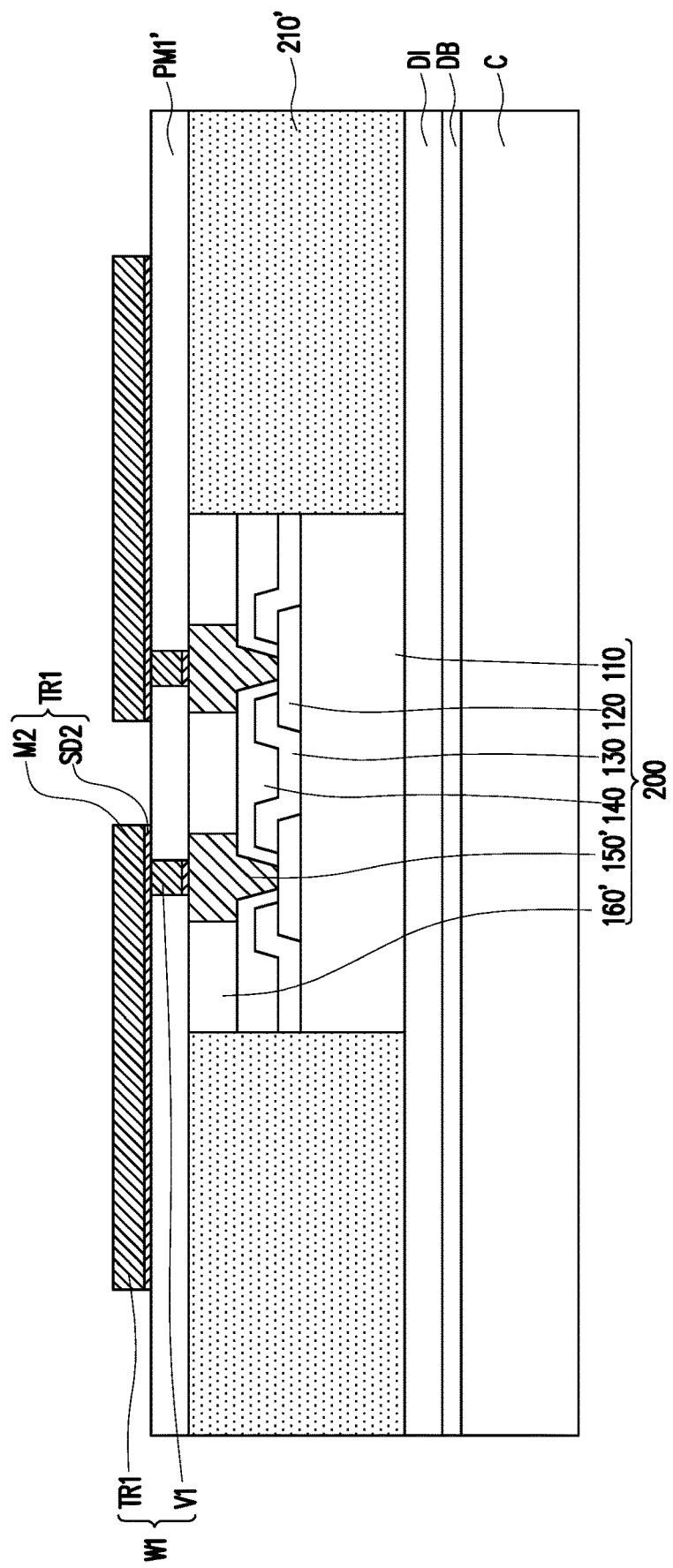
Figure 1M:
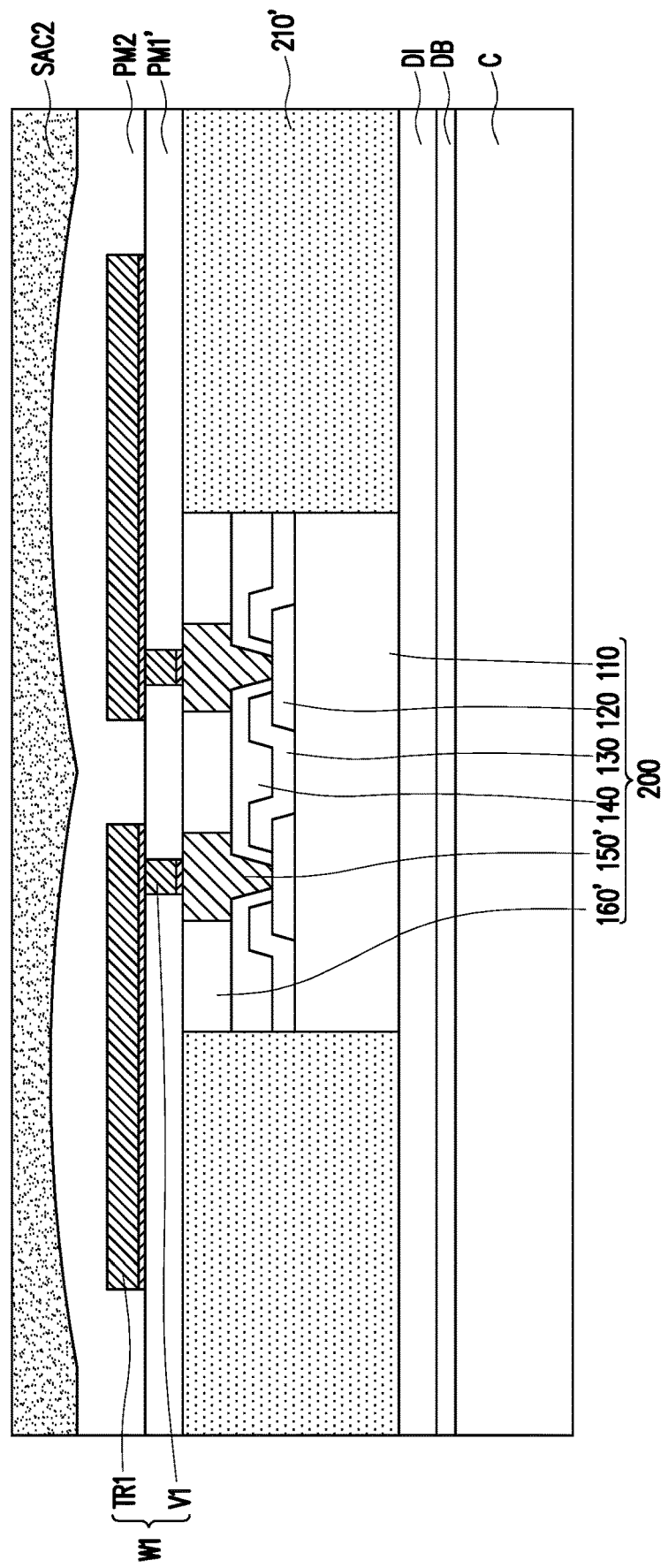
Figure 1N:
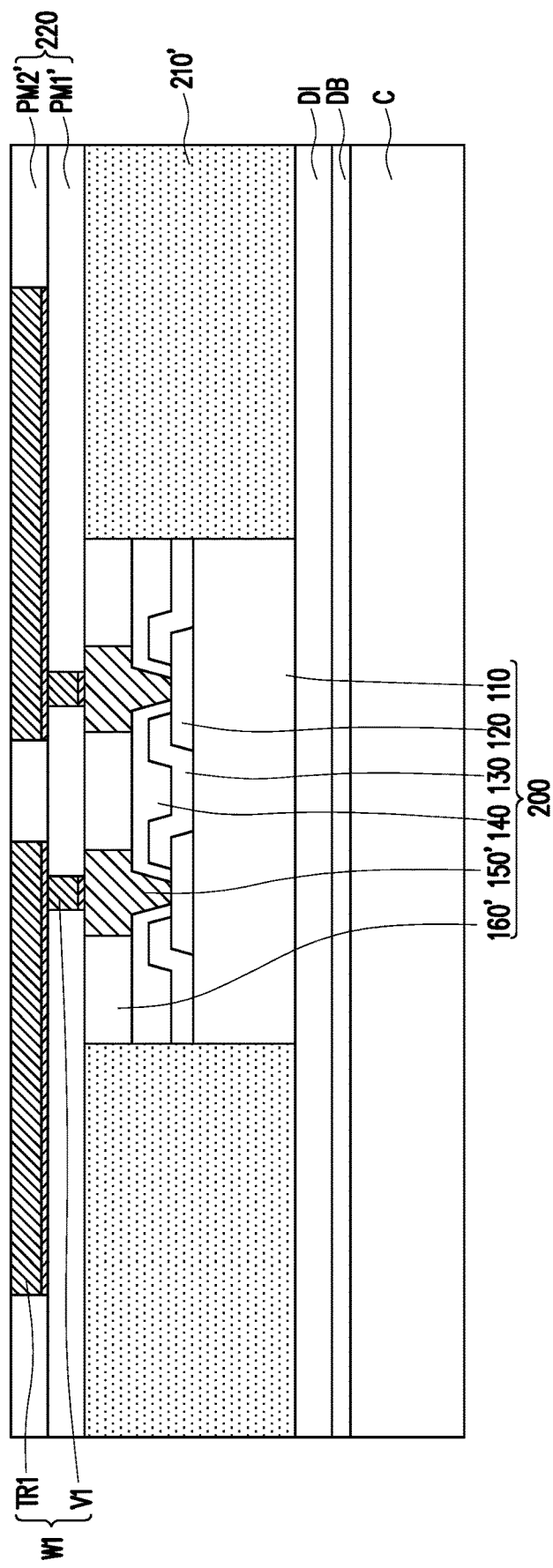
Figure 10:
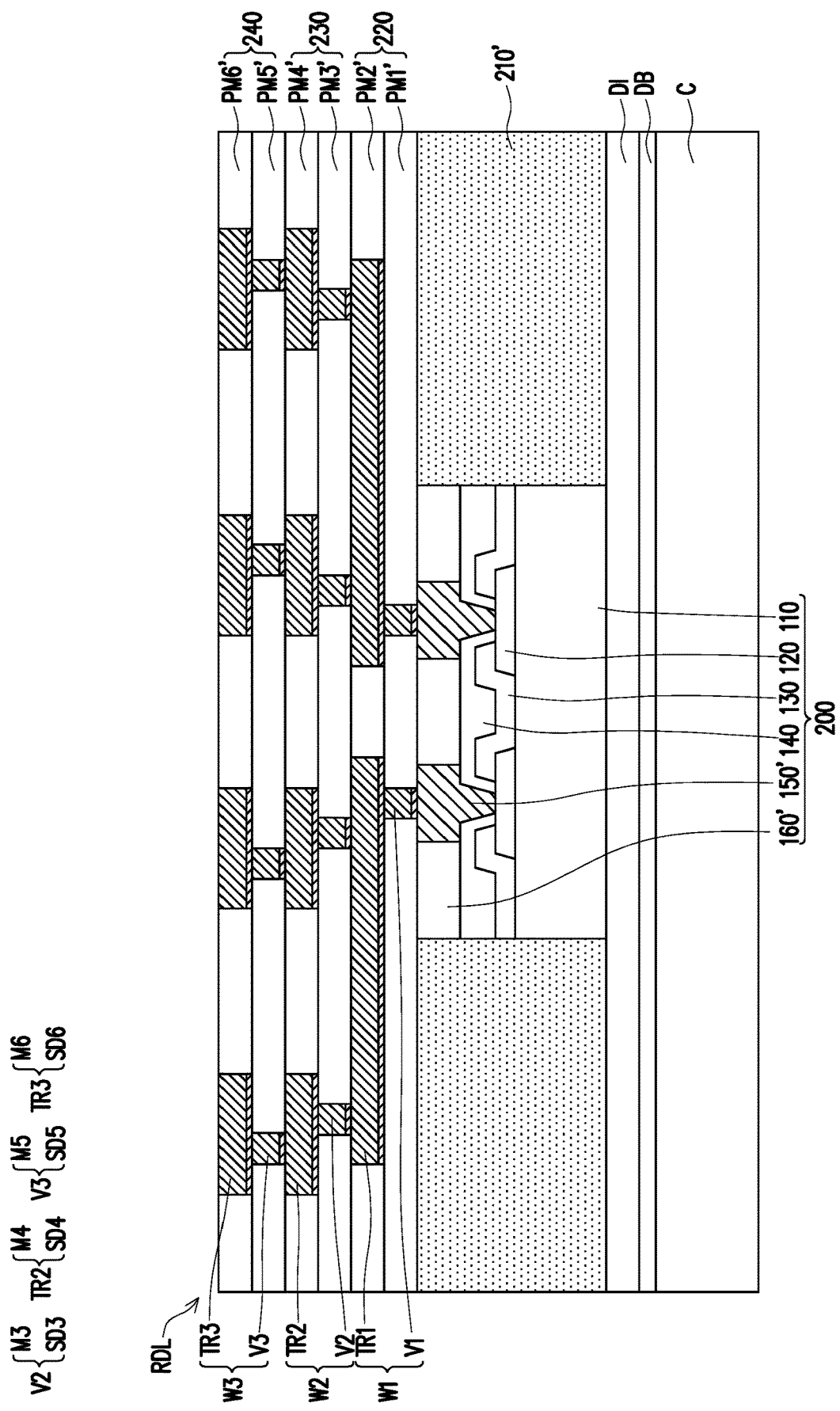
Figure 1P:
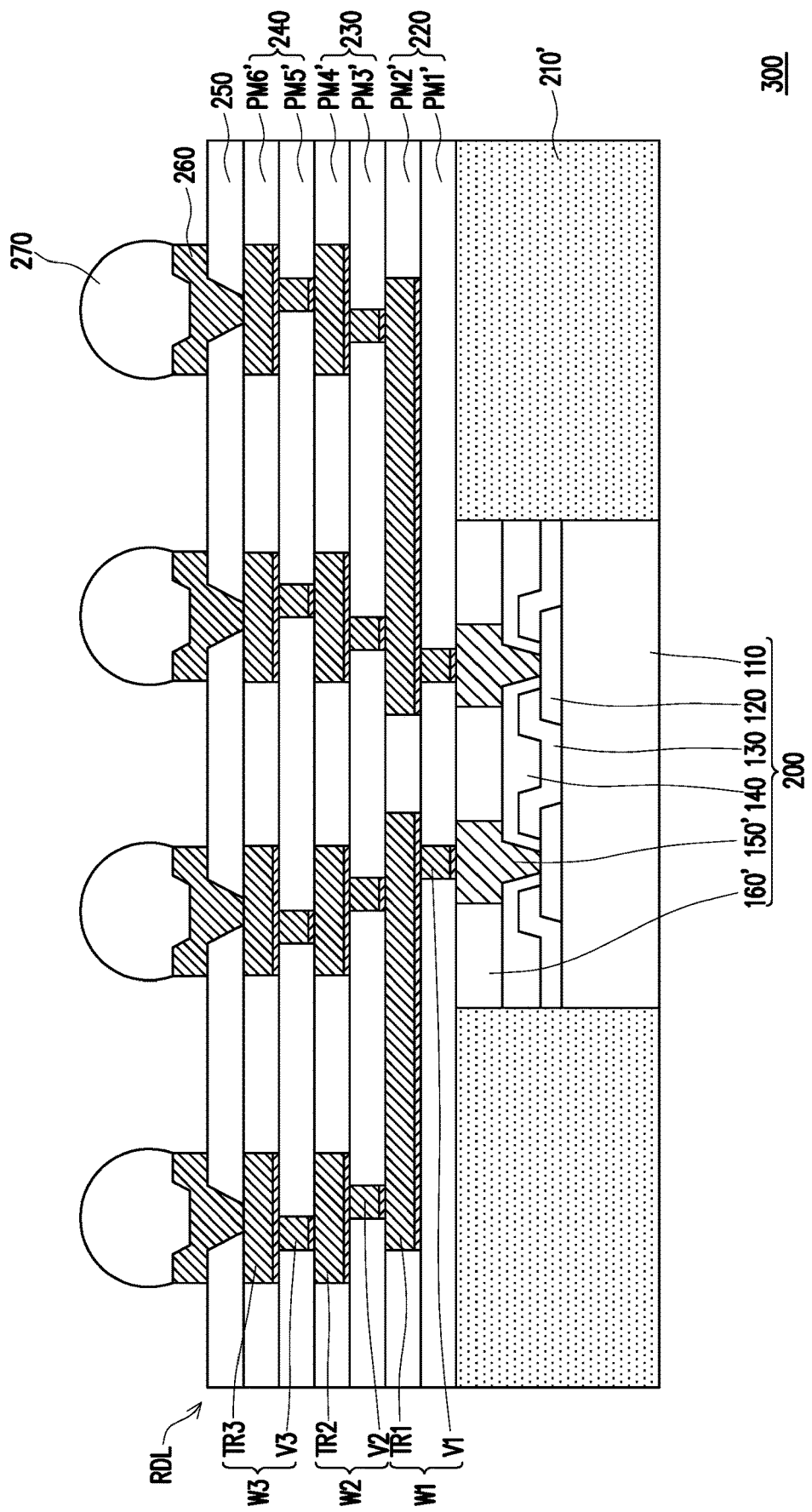
Figure 1Q:
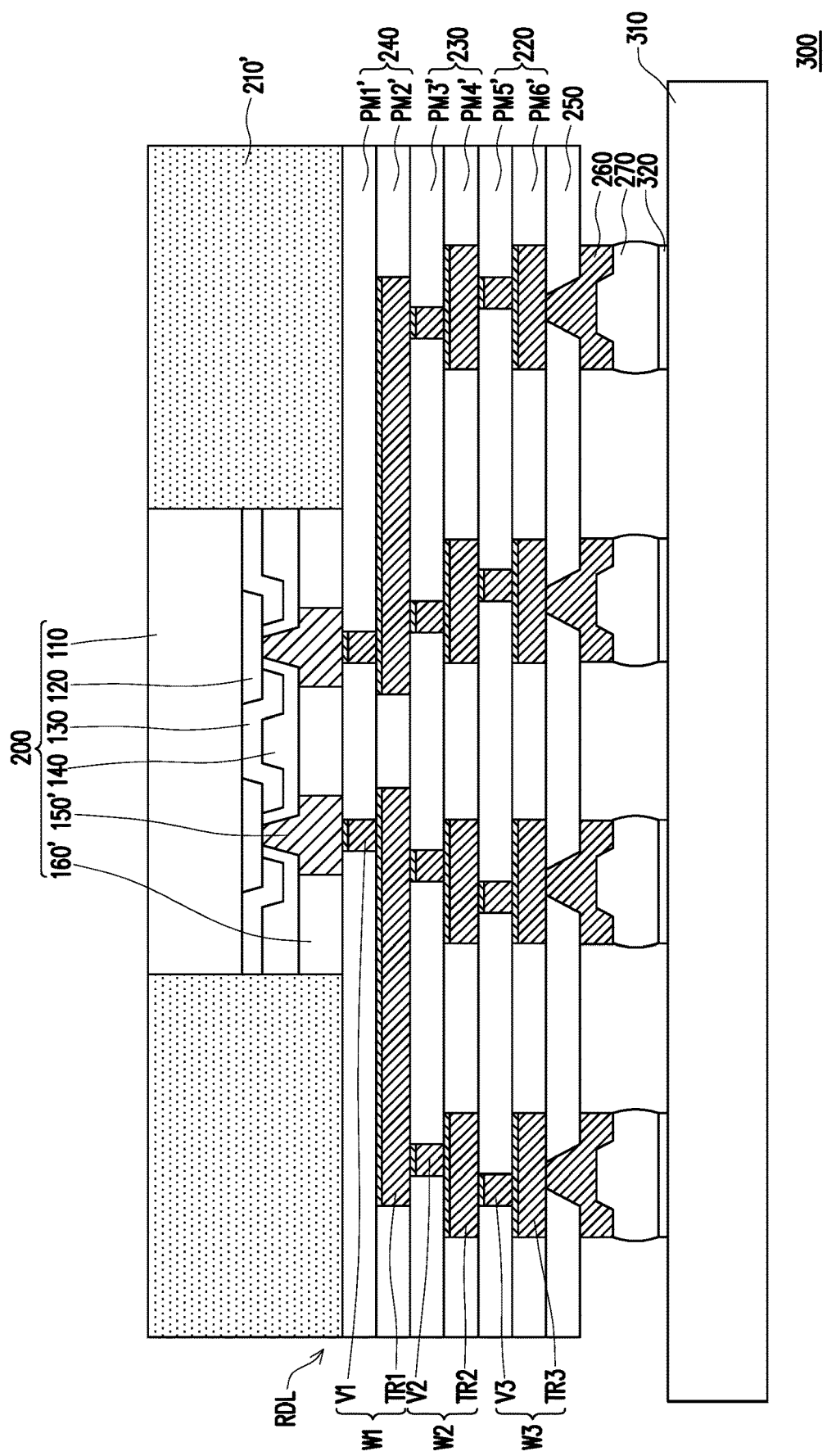
Figure 2:
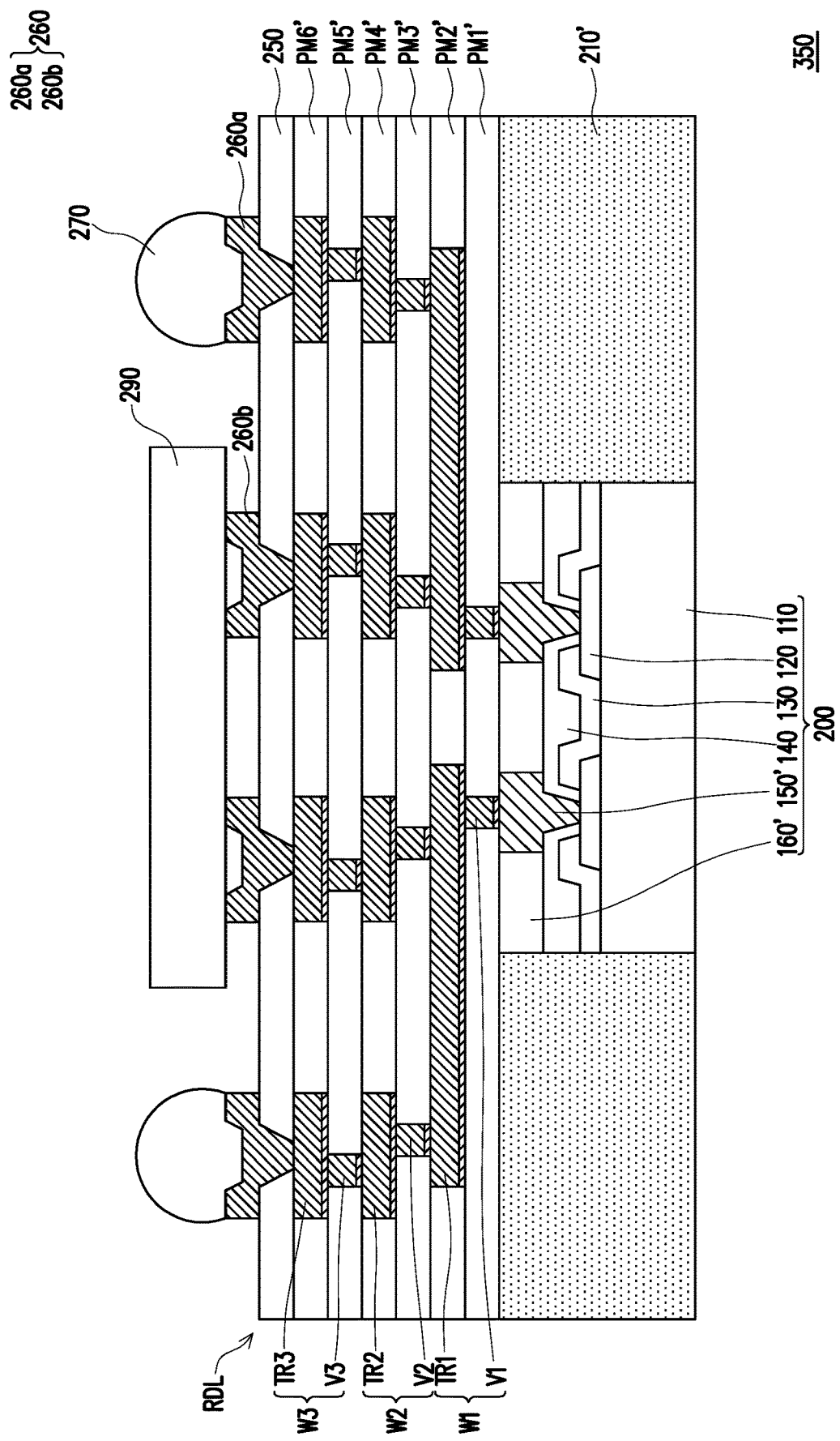
FIG. 2 is a cross-sectional view illustrating an integrated fan-out package in accordance with some alternative embodiments.

FIGS. 1A through 1Q illustrate a process flow for fabricating an integrated fan-out package in accordance with some embodiments, and FIG. 2 is a cross-sectional view illustrating an integrated fan-out package in accordance with some alternative embodiments.

Referring to FIG. 1A, a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example.

Referring to FIG. 1B, after the carrier C having the de-bonding layer DB and the dielectric layer DI formed thereon is provided, a semiconductor die 200 is picked and placed on the dielectric layer DI. In some embodiments, the semiconductor die 200 may include a semiconductor substrate 110, a plurality of conductive pads 120 formed on the semiconductor substrate 110, a passivation layer 130 and a post-passivation layer 140 formed over the semiconductor substrate 110, a plurality of conductive pillars 150 formed on the conductive pads 120, and a protection layer 160 formed on the post passivation layer 140 so as to cover the conductive pillars 150. For example, the semiconductor substrate 110 may be a silicon substrate including active components (e.g., transistors or the like) and passive components (e.g., resistors, capacitors, inductors or the like) formed therein and an interconnection structure formed on the silicon substrate; the conductive pads 120 may be aluminum pads, copper pads or other suitable metal pads; the passivation layer 130 may be a silicon oxide layer, a silicon nitride layer, a silicon oxy-nitride layer or a dielectric layer formed by other suitable dielectric materials; the post passivation layer 140 may be a polyimide (PI) layer, a polybenzoxazole (PBO) layer, or a dielectric layer formed by other suitable polymers; the conductive pillars 150 may be copper pillars or other suitable metal pillars; and the protection layer 160 may be a polybenzoxazole (PBO) layer, a polyimide (PI) layer or other suitable polymers.

As shown in FIG. 1B, in some embodiments, the semiconductor die 200 is attached or adhered on the dielectric layer DI through a die attach film (DAF), an adhesion paste or the like. In some alternative embodiments, more than one of the semiconductor dies 200 are picked and placed on the dielectric layer DI, wherein the semiconductor dies 200 placed on the dielectric layer DI may be arranged in an array.

Pluralities of conductive posts (not shown in FIG. 1B) may be formed on the dielectric layer DI. In some embodiments, the conductive posts are formed on the dielectric layer DI through a plating process. In some alternative embodiments, the conductive posts are pre-formed by other process and then disposed on the dielectric layer DI through a pick-up and place process.

Referring to FIG. 1C, an insulating material 210 is formed on the dielectric layer DI to cover the semiconductor die 200. In some embodiments, the insulating material 210 is a molding compound formed by a molding process. As shown in 1C, the protection layer 160 of the semiconductor die 200 is covered by the insulating material 210. In other words, the protection layer 160 of the semiconductor die 200 is not revealed and is well protected by the insulating material 210. In some embodiments, the insulating material 210 includes epoxy or other suitable dielectric materials.

Referring to FIG. 1D, the insulating material 210 is then ground until top surfaces of the conductive pillars 150 and a top surface of the protection layer 160 are exposed. In some embodiments, the insulating material 210 is ground by a mechanical grinding process and/or a chemical mechanical polishing (CMP) process. After the insulating material 210 is ground, an insulating encapsulation 210' is formed over the dielectric layer DI to laterally encapsulate the semiconductor die 200. During the grinding process of the insulating material 210, portions of the protection layer 160 are ground to form a protection layer 160'.

As shown in FIG. 1D, the insulating encapsulation 210' encapsulates sidewalls of the semiconductor die 200. That is to say, the semiconductor die 200 is laterally encapsulated by the insulating encapsulant 210'. In other words, the semiconductor die 200 is embedded in the insulating encapsulant 210'. It is noted that, and top surfaces of the conductive pillars 150' and a top surface of the protection layer 160' are substantially coplanar with a top surface of the insulating encapsulant 210'.

Referring to FIG. 1E through FIG. 1P, after the insulating encapsulant 210' is formed, a redistribution circuit structure RDL electrically connected to the conductive pillars 150' of the semiconductor die 200 is formed on the top surface of the insulating encapsulant 210', the top surfaces of the conductive pillars 150, and the top surface of the protection layer 160'. The redistribution circuit structure RDL is fabricated to electrically connect with one or more connectors underneath. Here, the afore-said connectors may be the conductive pillars 150' of the semiconductor die 200. The redistribution circuit structure RDL is described in detail in the following discussion.

The following descriptions are focused on a manufacturing method of the redistribution circuit structure RDL in accordance with FIG. 1E through FIG. 1P.

Referring to FIG. 1E, a first seed layer SD1 is formed on the insulating encapsulant 210' and the semiconductor die 200. In some embodiments, the first seed layer SD1 entirely covers the top surface of the insulating encapsulant 210', the top surfaces of the conductive pillars 150, and the top surface of the protection layer 160'.

In some embodiments, the first seed layer SD1 may be a copper seed layer, a titanium/copper (Ti/Cu) seed layer or other metal seed layers. A method of forming the first seed layer SD1 may include a physical vapor deposition (PVD) process (e.g., a sputtering process) or other suitable process, but the disclosure is not limited thereto.

Still referring to FIG. 1E, after the first seed layer SD1 is formed on the insulating encapsulant 210' and the semiconductor die 200, a first patterned photoresist PR1 is formed over the first seed layer SD1, wherein the first patterned photoresist PR1 has a plurality of openings revealing portions of the first seed layer SD1 that are located above and corresponding to the conductive pillars 150'. For example, the first patterned photoresist PR1 may be positive tone photoresist or negative tone photoresist, but the disclosure is not limited thereto. In some embodiments, the first patterned photoresist PR1 is patterned by photolithography process.

Referring to FIG. 1F and FIG. 1G, after the first patterned photoresist PR1 including the plurality of the openings is formed over the first seed layer SD1, a plurality of conductive layer M1 are plated on the first seed layer SD1 exposed by the openings of the first patterned photoresist PR1. The plating process of the conductive layers M1 is described in detail as followings. For example, the carrier C including the semiconductor die 200, the insulating encapsulant 210', the first seed layer SD1, and the first patterned photoresist PR1 formed thereon may be immersed into a plating solution in a plating bath such that the conductive layers M1 are plated on the portions of the first seed layer SD1 revealed by the openings of the first patterned photoresist PR1. After plating the conductive layers M1, the first patterned photoresist PR1 is stripped. Thereafter, by using the conductive layers M1 as a hard mask, portions of the first seed layer SD1 that are not covered by the conductive layers M1 may be removed through etching until the insulating encapsulant 210', the conductive pillars 150', and the protection layer 160' are revealed, for example. After etching, in some embodiments, the conductive layers M1 and the underlying first seed layers SD1 may be referred to as vias V1. In other words, the vias V1 are formed on the conductive pillars 150'. In some embodiments, the conductive layers M1 may include copper, but the disclosure is not limited thereto.

Referring to FIG. 1H, after the vias V1 are formed on the conductive pillars 150', a first dielectric material PM1 is formed on the insulating encapsulant 210' and the semiconductor die 200 to conformally cover the vias V1. That is to say, a thickness of the first dielectric material PM1 is greater than a thickness of the vias V1, for example. In some embodiments, since the top surfaces of the conductive pillars 150' and the top surface of the protection layer 160' are substantially coplanar with the top surface of the insulating encapsulant 110', a surface topography of a top surface of the first dielectric material PM1 is higher than a surface topography of the top surfaces of the semiconductor die 200 and the insulating encapsulant 210'. In other words, a degree of planarization (DOP) of the top surface of the first dielectric material PM1 is smaller than degrees of planarization (DOP) of the top surfaces of the semiconductor die 200 and the insulating encapsulant 210'. That is, the top surface of the first dielectric material PM1 may have a plurality of protruding features corresponding to the vias V1 disposed thereunder. A degree of planarization (DOP) is a measure of surface topography. Higher degree of planarization (DOP) indicates a surface is more planar, whereas low degree of planarization (DOP) indicates an uneven surface. The evaluation of degree of planarization (DOP) is explained in enlarged view of an area between the first dielectric material PM1 and one of the vias V1 shown in FIG. 1H. Here, the degree of planarization (DOP) is evaluated using the equation DOP=$1-h_f/h_o$, wherein $h_f$ is a height of the protruding feature and $h_o$ is a height of the feature underlying the protruding feature. The height of the protruding feature is measured from a base of an incline of the protruding feature vertically upwards to a peak level of the protruding feature. In some embodiments, the first dielectric material PM1 may be a polymer including polyimide, PBO, BCB, Ajinomoto Buildup Film (ABF), Solder Resist film (SR), or the like. The first dielectric material PM1 may be formed by a suitable fabrication technique such as spin-coating, lamination, deposition, or the like.

Thereafter, a first sacrificial layer SAC1 is formed on the first dielectric material PM1 to cover the first dielectric material PM1. In some embodiments, a thickness of the first sacrificial layer SAC1 is greater than the thickness of the first dielectric material PM1, but the disclosure is not limited thereto. In some alternative embodiments, the thickness of the first sacrificial layer SAC1 may be substantially equal to the thickness of the first dielectric material PM1, as long as the first sacrificial layer SAC1 can provide a required removal amount for subsequent removal process. In some embodiments, a surface topography of a top surface of the first sacrificial layer SAC1 is lower than a surface topography of the top surface of the first dielectric material PM1. That is to say, the top surface of the first sacrificial layer SAC1 is flatter than the top surface of the first dielectric material PM1. In other words, a degree of planarization (DOP) of the top surface of the first sacrificial layer SAC1 is greater than the degree of planarization (DOP) of the top surface of the first dielectric material PM1. In some embodiments, the material of the first sacrificial layer SAC1 may include polymethylmethacrylate (PMMA), Novolac based photoresist, or the like. In some other embodiments, the material of the first sacrificial layer SAC1 may include polymer solution such as polyimide, epoxy, or the like having high viscosity such that the first sacrificial layer SAC1 may have non-conformal profile. The first sacrificial layer SAC1 may be formed by a suitable fabrication technique such as spin-coating, lamination, deposition, or the like.

Referring to FIG. 1I, after the first sacrificial layer SAC1 is formed on the first dielectric material PM1, a removal process is then performed to remove the first sacrificial layer SAC1 and a portion of the first dielectric material PM1 until the vias V1 are revealed such that a first dielectric material PM1' with the vias V1 embedded therein is formed. In some embodiments, the removal process may include an anisotropic etch process such as a dry etch process. The removal process or the anisotropic etch process is performed through ion bombardment of a plasma. The plasma used in the removal process may include $O_2$ plasma, $CF_4$ plasma, $SF_6$ plasma, or combination thereof. Furthermore, due to etch selectivity of the first sacrificial layer SAC1 and the first dielectric material PM1, the first sacrificial layer SAC1 may be etched by the anisotropic etch process at a first etching rate and the first dielectric material PM1 may be etched by the anisotropic etch process at a second etching rate greater than the first etching rate such that the first dielectric material PM1' may have a flatter top surface. For example, the first etching rate may range from about 0.05 um/min to about 2.5 um/min, and the second etching rate may range from about 0.05 um/min to about 2.5 um/min.

As shown in FIG. 1I, after the removal process is performed, the vias V1 are revealed through the first dielectric material PM1'. In some embodiments, portions of top surfaces of the vias V1 may also be removed during the removal process. That is, the top surfaces of the vias V1 are substantially coplanar with the top surface of the first dielectric material PM1'. In some embodiments, after the removal process, the surface topography the top surface of the first dielectric material PM1' (shown in FIG. 1I) is lower than the surface topography the top surface of the first dielectric material PM1 (shown in FIG. 1H). In other words, the removal process utilizing the first sacrificial layer SAC1 increases the degree of planarization (DOP) of the top surface of the first dielectric material PM1. After the removal process, the degree of planarization (DOP) of the top surface of the first dielectric material PM1' may range from about 0.93 to about 0.96.

Referring to FIG. 1J, a second seed layer SD2 is formed on the vias V1 and the first dielectric material PM1'. In some embodiments, the second seed layer SD2 entirely covers the vias V1 and the first dielectric material PM1'. In some embodiments, the second seed layer SD2 may be a copper seed layer, a titanium/copper (Ti/Cu) seed layer or other metal seed layers. A method of forming the first seed layer SD2 may include a physical vapor deposition (PVD) process (e.g., a sputtering process) or other suitable process, but the disclosure is not limited thereto.

As shown in FIG. 1J, after the second seed layer SD2 is formed on the vias V1 and the first dielectric material PM1', a second patterned photoresist PR2 is formed over the second seed layer SD2, wherein the first patterned photoresist PR2 has a plurality of openings revealing portions of the second seed layer SD2 that are located above and corresponding to the vias V1. For example, the second patterned photoresist PR2 may be positive tone photoresist or negative tone photoresist, but the disclosure is not limited thereto. In some embodiments, the second patterned photoresist PR2 is patterned by photolithography process.

Referring to FIG. 1K and FIG. 1L, after the second patterned photoresist PR2 including the plurality of the openings is formed over the second seed layer SD2, a plurality of conductive layers M2 are plated on portions of the second seed layer SD2 exposed by the openings of the second patterned photoresist PR2. The plating process of the conductive trace M1 is described in detail as followings. For example, the carrier C including the above-mentioned structures and the second patterned photoresist PR2 formed thereon may be immersed into a plating solution in a plating bath such that the conductive layers M2 are plated on the portions of the second seed layer SD2 revealed by the openings of the second patterned photoresist PR2. After plating the conductive layers M2, the second patterned photoresist PR2 is stripped. Thereafter, by using the conductive layers M2 as a hard mask, portions of the second seed layer SD2 that are not covered by the conductive layers M2 may be removed through etching until the first dielectric material PM1' is revealed, for example. After etching, in some embodiments, the conductive layers M2 and the underlying second seed layers SD2 may be referred to as traces TR1. In other words, the traces TR1 are formed on the vias V1 and the first dielectric material PM1'. Since the traces TR1 are in physical and electrical contacts with the vias V1, the traces TR1 and the vias V1 may be referred to as first conductive wirings W1, and the first conductive wirings W1 are electrically connected to the conductive pillars 150' of the semiconductor die 200. In some embodiments, the conductive layers M2 may include copper, but the disclosure is not limited thereto.

Referring to FIG. 1M, after the traces TR1 are formed on the vias V1 and the first dielectric material PM1', a second dielectric material PM2 is formed on the first dielectric material PM1' to conformally cover the traces TR1. That is to say, a thickness of the second dielectric material PM2 is greater than a thickness of the traces TR1. In some embodiments, a surface topography of a top surface of the second dielectric material PM2 is higher than the surface topography of the top surface of the first dielectric material PM1'. That is to say, the top surface of the first dielectric material PM1' is flatter than the top surface of the second dielectric material PM2. In other words, a degree of planarization (DOP) of the top surface of the second dielectric material PM2 is smaller than the degree of planarization (DOP) of the top surface of the first dielectric material PM1'. In some embodiments, the second dielectric material PM2 may be a polymer including polyimide, PBO, BCB, Ajinomoto Buildup Film (ABF), Solder Resist film (SR), or the like. The second dielectric material PM2 may be formed by a suitable fabrication technique such as spin-coating, lamination, deposition, or the like.

Thereafter, a second sacrificial layer SAC2 is formed on the second dielectric material PM2 to cover the second dielectric material PM2. In some embodiments, a thickness of the second sacrificial layer SAC2 is greater than the thickness of the second dielectric material PM2, but the disclosure is not limited thereto. In some alternative embodiments, the thickness of the second sacrificial layer SAC2 may be substantially equal to the thickness of the second dielectric material PM2, as long as the second sacrificial layer SAC2 can provide a required removal amount for subsequent removal process. In some embodiments, a surface topography of the top surface of the second sacrificial layer SAC2 is lower than the surface topography of the top surface of the second dielectric material PM2. That is to say, the top surface of the second sacrificial layer SAC2 is flatter than the top surface of the second dielectric material PM2. In other words, a degree of planarization (DOP) of the top surface of the second sacrificial layer SAC2 is greater than the degree of planarization (DOP) of the top surface of the second dielectric material PM2. In some embodiments, the second sacrificial layer SAC2 may include polymethylmethacrylate (PMMA), Novolac based photoresist, or the like. In some other embodiments, the material of the first sacrificial layer SAC1 may include polymer solution such as polyimide, epoxy, or the like having high viscosity such that the first sacrificial layer SAC1 may have non-conformal profile. The second sacrificial layer SAC2 may be formed by a suitable fabrication technique such as spin-coating, lamination, deposition, or the like.

Referring to FIG. 1N, after the second sacrificial layer SAC2 is formed on the second dielectric material PM2, a removal process is then performed to remove the second sacrificial layer SAC2 and a portion of the second dielectric material PM2 until the traces TR1 are revealed such that a second dielectric material PM2' with the traces TR1 embedded therein is formed on the first dielectric material PM1'. In some embodiments, the removal process may be an anisotropic etch process such as a dry etch process. The removal process or the anisotropic etch process is performed through ion bombardment of a plasma. The plasma used in the removal process may include $O_2$ plasma, $CF_4$ plasma, $SF_6$ plasma, or combination thereof. Furthermore, due to etch selectivity of the second sacrificial layer SAC2 and the second dielectric material PM2, the second sacrificial layer SAC2 may be etched by the anisotropic etch process at a first etching rate and the second dielectric material PM2 may be etched by the anisotropic etch process at a second etching rate greater than the first etching rate such that the second dielectric material PM2' may have a flatter top surface. For example, the first etching rate may range from about 0.05 um/min to about 2.5 um/min, and the second etching rate may range from about 0.05 um/min to about 2.5 um/min.

As shown in FIG. 1N, after the removal process is performed, the traces TR1 are revealed through the second dielectric material PM2'. In some embodiments, portions of top surfaces of the traces TR1 may also be removed during the removal process. That is, the top surfaces of the TR1 are substantially coplanar with the top surface of the second dielectric material PM2'. In some embodiments, after the removal process, the surface topography of the top surface of the second dielectric material PM2' (shown in FIG. 1N) is lower than the surface topography the top surface of the second dielectric material PM2 (shown in FIG. 1M). In other words, the removal process utilizing the second sacrificial layer SAC2 increases the degree of planarization (DOP) of the top surface of the second dielectric material PM2. After the removal process, the degree of planarization (DOP) of the top surface of the second dielectric material PM2' may range from about 0.93 to about 0.96.

Still referring to FIG. 1N, in some embodiments, the first dielectric material PM1' and the second dielectric material PM2' may be referred to as a first dielectric layer 220. That is to say, the first conductive wirings W1 including the traces TR1 and the vias V1 are embedded in the first dielectric layer 220.

Referring to FIG. 1O, in some embodiments, the above-mentioned steps as illustrated in FIG. 1E through FIG. 1N may be performed multiple times to obtain a multi-layered redistribution circuit layer as required by the circuit design. In other words, the redistribution circuit structure RDL may include a plurality of conductive wirings and a plurality of dielectric layers stacked alternately. For example, a second conductive wirings W2 having vias V2 including a third seed layer SD3 and a plurality of conductive layers M3; and traces TR2 including a fourth seed layer SD4 and a plurality of conductive layers M4 are formed on the first conductive wirings W1 and embedded in a second dielectric layer 230 including a third dielectric material PM3 and a fourth dielectric material PM4, wherein the second conductive wirings W2 are in physical and electrical contacts with the first conductive wirings W1.

Still referring to FIG. 1O, in some embodiments, a third conductive wirings W3 having vias V3 including a fifth seed layer SD5 and a plurality of conductive layers M5; and traces TR3 including a sixth seed layer SD6 and a plurality of conductive layers M6 are formed on the second conductive wirings W2 and embedded in a third dielectric layer 240 including a fifth dielectric material PM5 and a sixth dielectric material PM6, wherein the third conductive wirings W3 are in physical and electrical contacts with the second conductive wirings W2. As such, the manufacturing method of the redistribution circuit structure RDL is substantially completed.

Referring to FIG. 1P, in some embodiments, a patterned passivation layer 250 is formed on the redistribution circuit structure RDL, wherein patterned passivation layer 250 has a plurality of openings revealing portions of a topmost conductive wiring (the conductive wiring W3, for example) of the redistribution structure RDL. The patterned passivation layer 250 may be a polyimide (PI) layer, a polybenzoxazole (PBO) layer, or a dielectric layer formed by other suitable polymers.

As shown in FIG. 1P, a plurality of pads 260 are formed on the portions of the topmost conductive wiring W3 of the redistribution circuit structure RDL revealed by the openings of the patterned passivation layer 250. In some embodiments, the pads 260 may be an under-ball metallurgy (UBM), but the disclosure is not limited thereto. In some alternative embodiments, the pads 260 may include the under-ball metallurgy (UBM) patterns for ball mount and connection pads for mounting of passive components (discussed in accordance with FIG. 2 later on). In some embodiments, the pads 260 also covers sidewalls of the openings of the passivation layer 250 and extends to partially cover the top surface of the passivation layer 250. The pads 260 are electrically connected to the topmost conductive wiring W3 of the redistribution circuit structure RDL through the openings of the patterned passivation layer 250. In other words, the pads 260 are electrically connected to the conductive pillars 150' of the semiconductor die 200 through the redistribution circuit structure RDL. It is noted that the number of the pads 260 is not limited in the disclosure. As shown in FIG. 1P, after the pads 260 are formed, a plurality of conductive balls 270 are placed on the pads 260. The conductive balls 270 may include copper, aluminum, lead-free alloys (e.g., gold, tin, silver, aluminum, or copper alloys) or lead alloys (e.g., lead-tin alloys). In some embodiments, the conductive balls 270 are placed on the pads 260 by a ball placement process. As such, after conductive balls 270 are placed on the pads 260, the integrated fan-out package 300 is substantially formed.

FIG. 2 is a cross-sectional view illustrating an integrated fan-out package 350 in accordance with some alternative embodiments. Referring to FIG. 1P and FIG. 2, the integrated fan-out package 350 as illustrated in FIG. 2 is similar to the integrated fan-out package 300 as illustrated in FIG. 1P except that the pads 260 may include under-ball metallurgy (UBM) patterns 260a for ball mount and connection pads 260b for mounting of passive components.

As shown in FIG. 2, after the UBM patterns 260a and the connection pads 260b are formed, a plurality of conductive balls 270 are placed on the under-ball metallurgy patterns 260a and a plurality of passive components 290 are mounted on the connection pads 260b. In some embodiments, the conductive balls 270 may be placed on the under-ball metallurgy patterns 260a by a ball placement process, and the passive components 290 may be mounted on the connection pads 260b through a solder or reflow process. In some embodiments, a height of the conductive balls 270 is greater than a height of the passive components 290. In some embodiments, the passive components 290 include resistors, capacitors, inductors or the like.

Referring back to FIG. 1P, a de-bonding process is performed such that the integrated fan-out package 300 with or without the dielectric layer DI is de-bonded from the de-bonding layer DB and the carrier C (not shown for brevity). In some embodiments, the de-bonding layer DB (e.g., the LTHC release layer) may be irradiated by an UV laser such that the integrated fan-out package 300 is de-bonded from the carrier C. In some embodiments, the dielectric layer DI may be ground to reveal the bottom surface of the insulating encapsulant 210' when the integrated fan-out package 300 includes the dielectric layer DI, but the disclosure is not limited thereto. In some alternative embodiments, the dielectric layer DI may be patterned when conductive posts are included in the integrated fan-out package 300 such that a plurality of contact openings (not shown) is formed in the dielectric layer DI to reveal the conductive posts (not shown) embedded in the insulating encapsulant 210'.

Referring to FIG. 1Q, after performing the de-bonding process, the integrated fan-out package 300 de-bonded from the carrier C may be flipped (turned upside down) and mounted onto a printed circuit board (PCB) 310 including pads formed thereon such that the conductive balls 270 are mounted on and electrically connected to the printed circuit board (PCB) 310 through the pads 320.

Figure 3A:
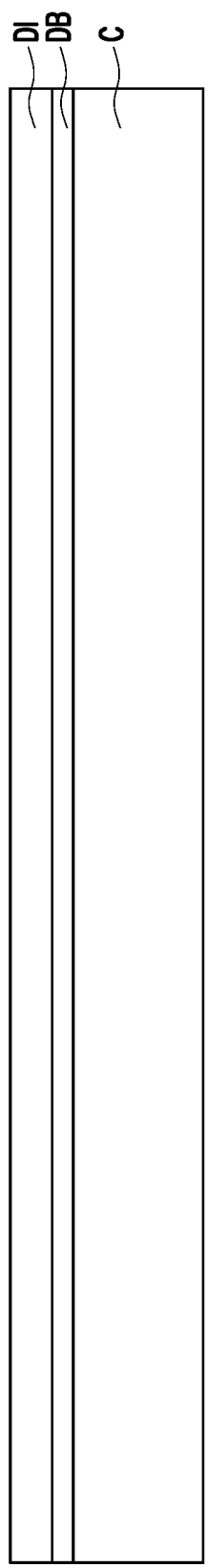
FIGS. 3A through 3Q illustrate a process flow for fabricating an integrated fan-out package in accordance with some embodiments.
Figure 3C:
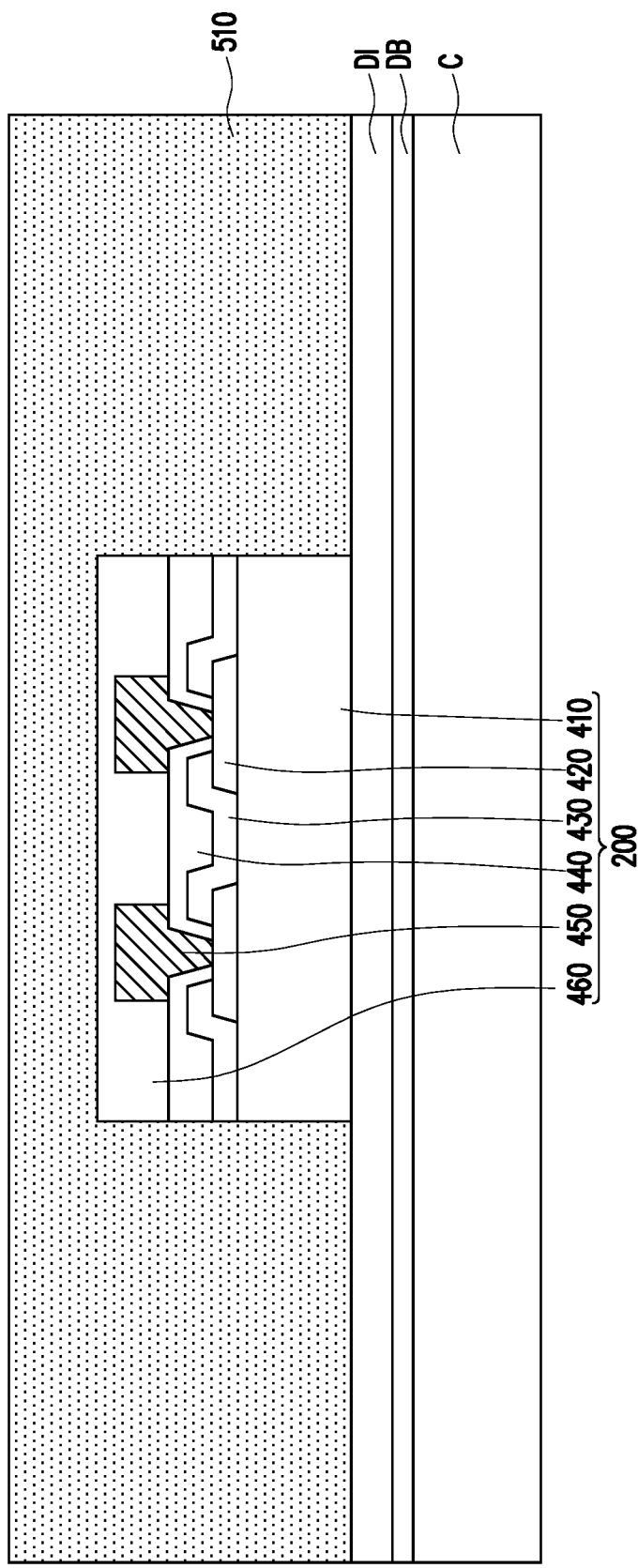
Figure 3D:
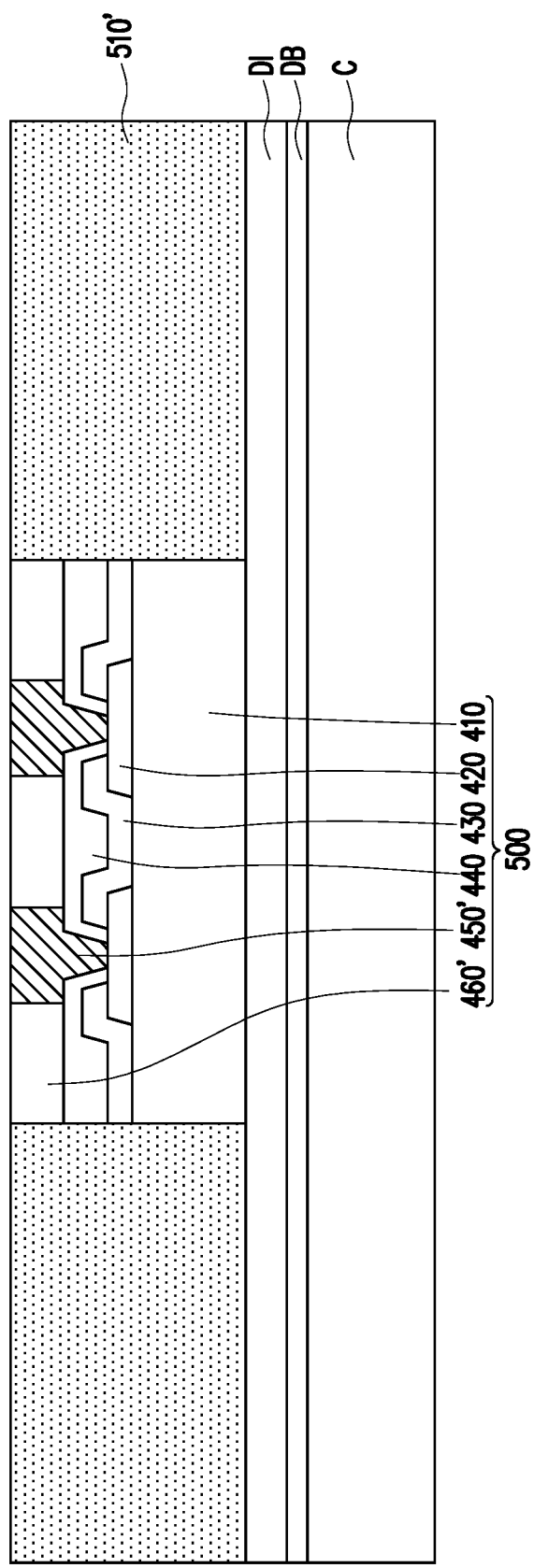
Figure 3E:
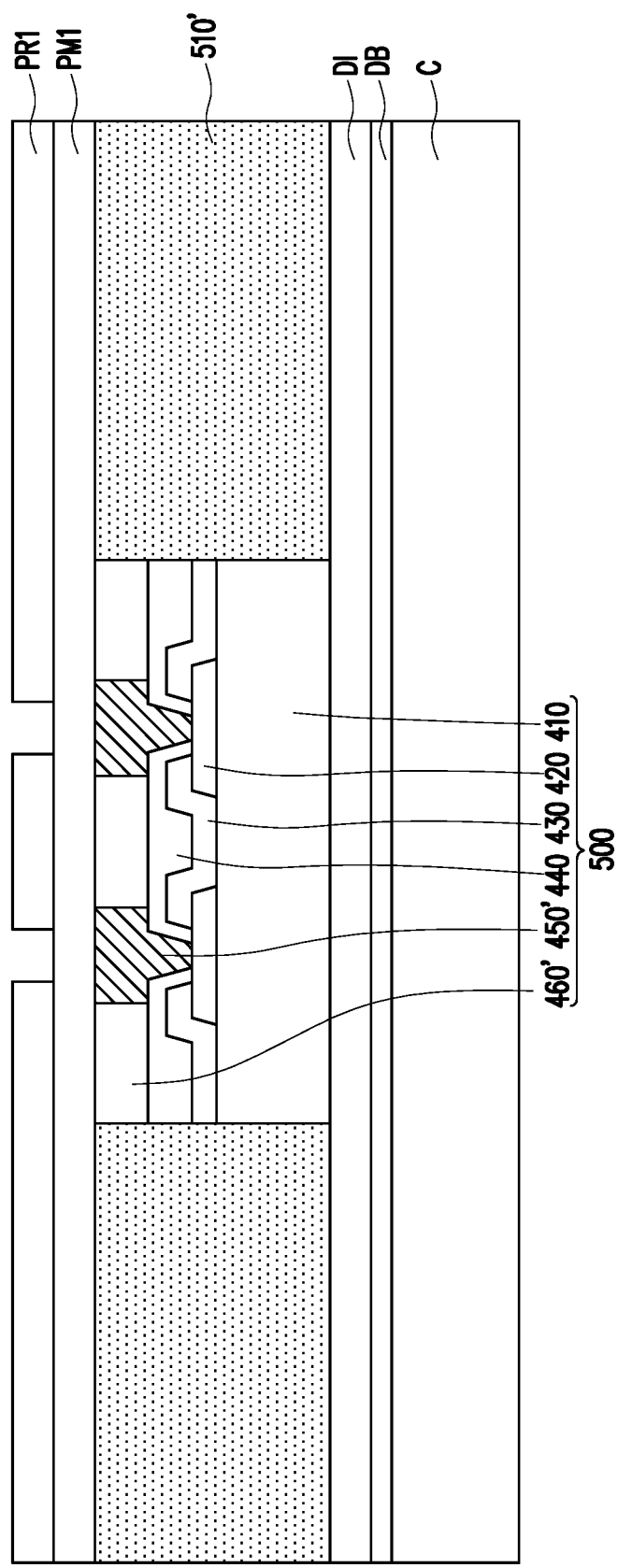
Figure 3F:
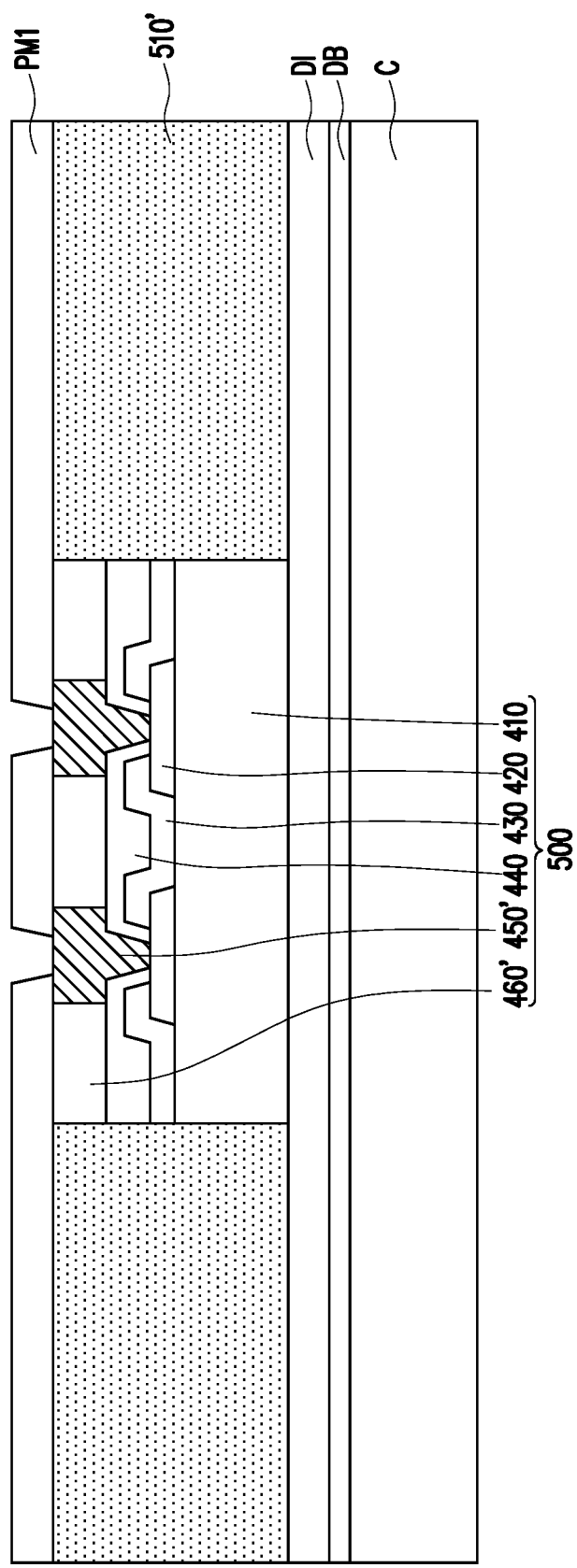
Figure 3G:
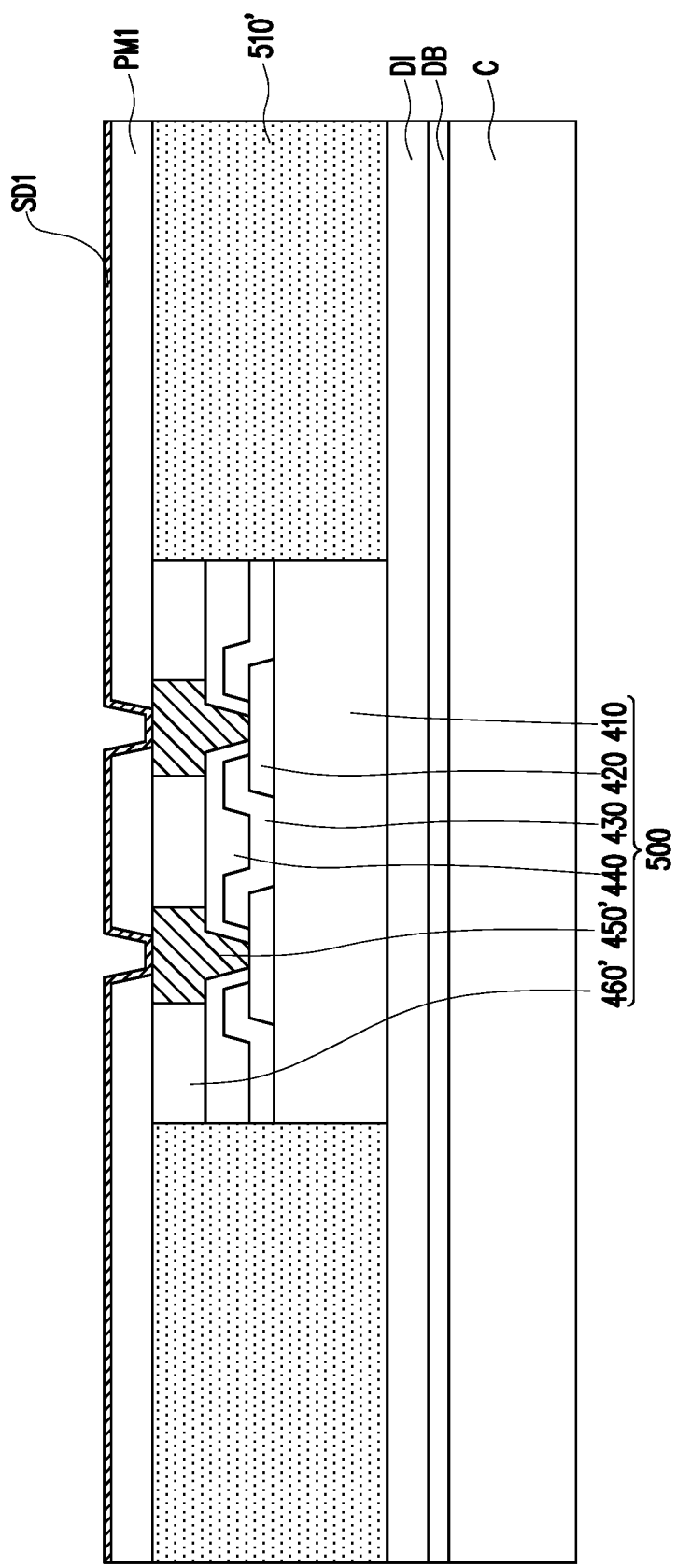
Figure 3H:
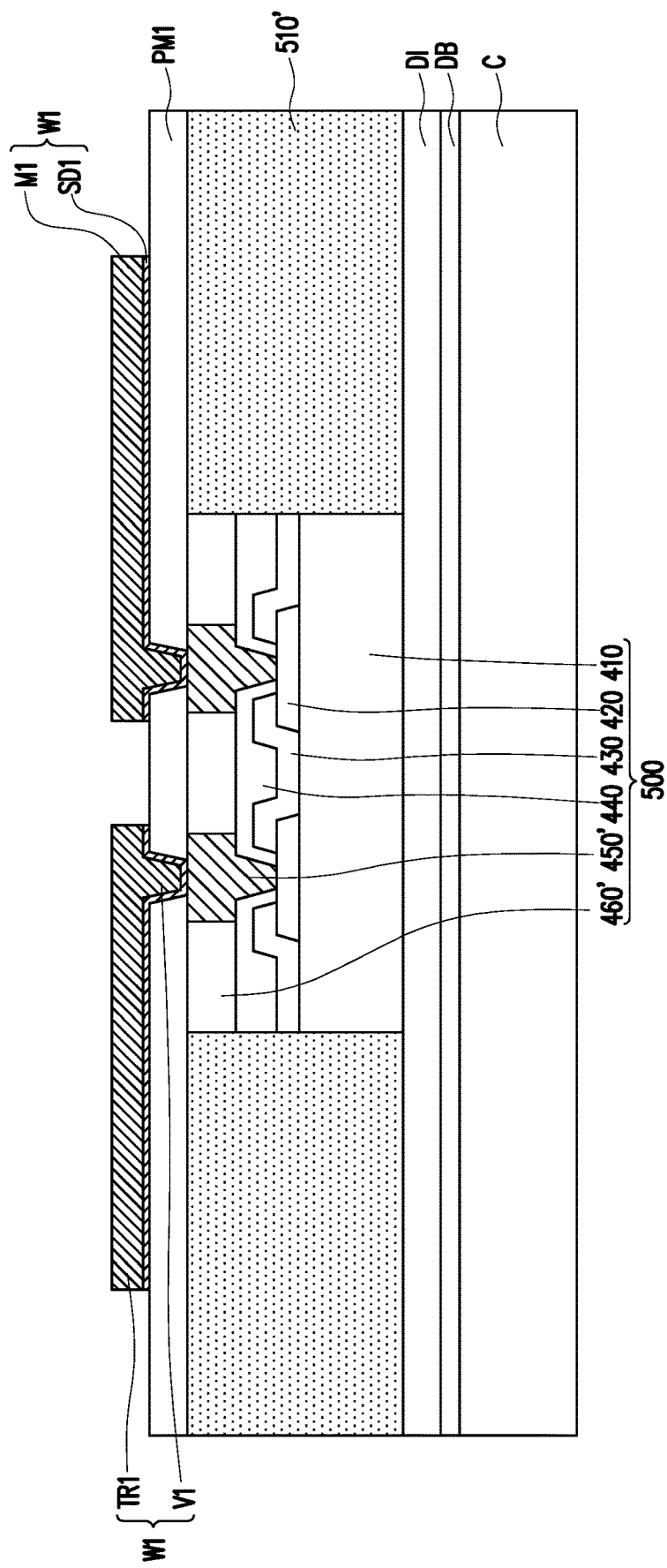
Figure 3I:
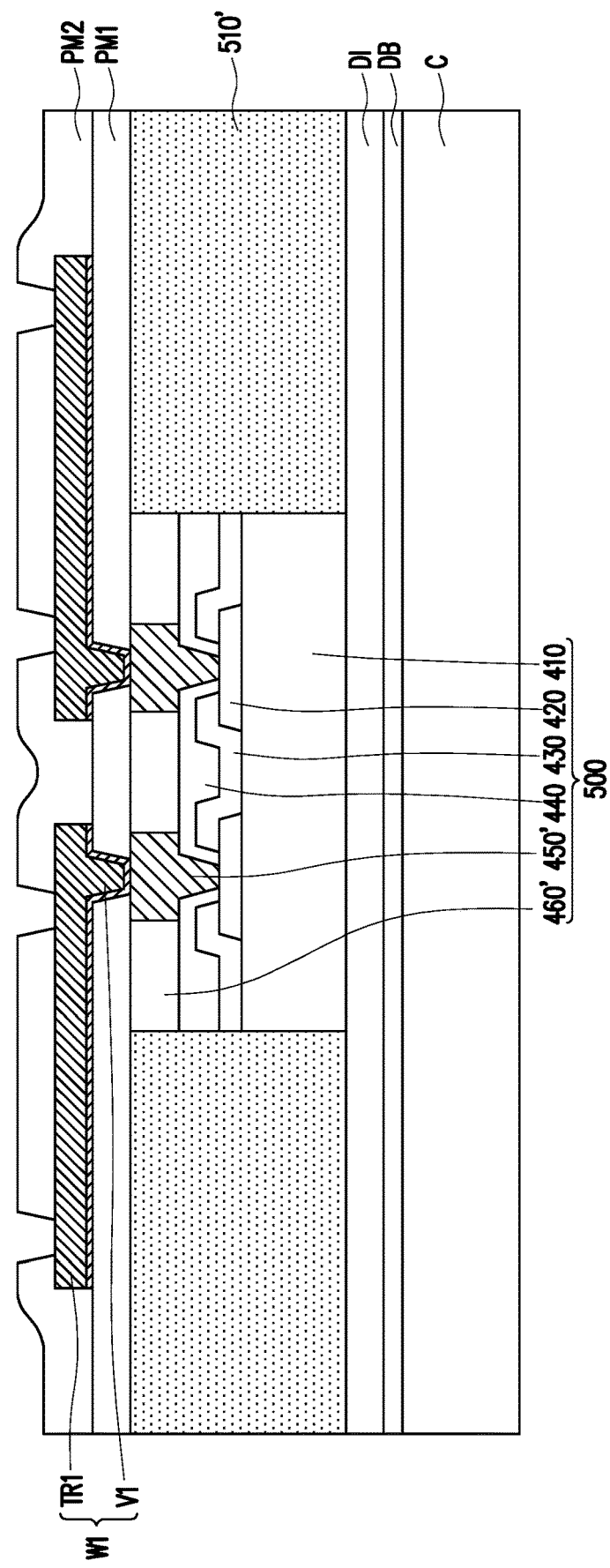
Figure 3J:
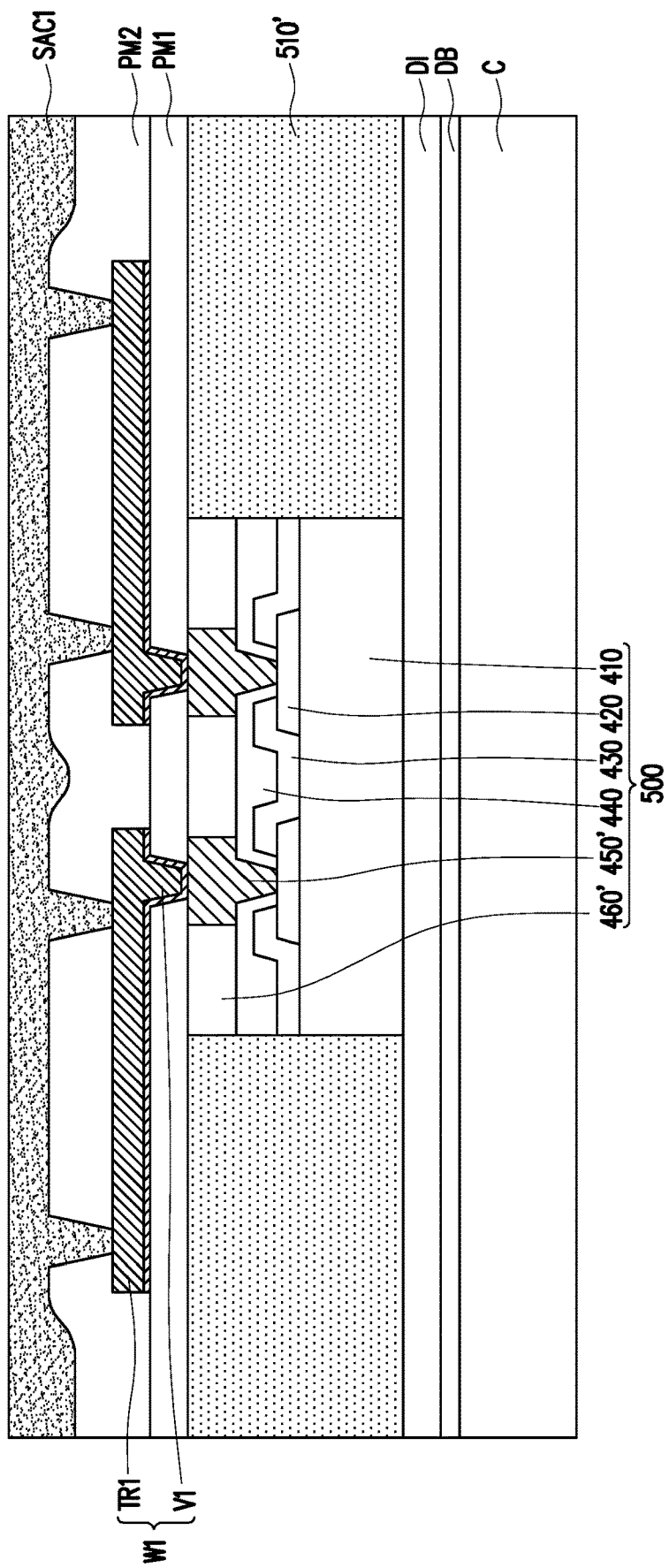
Figure 3K:
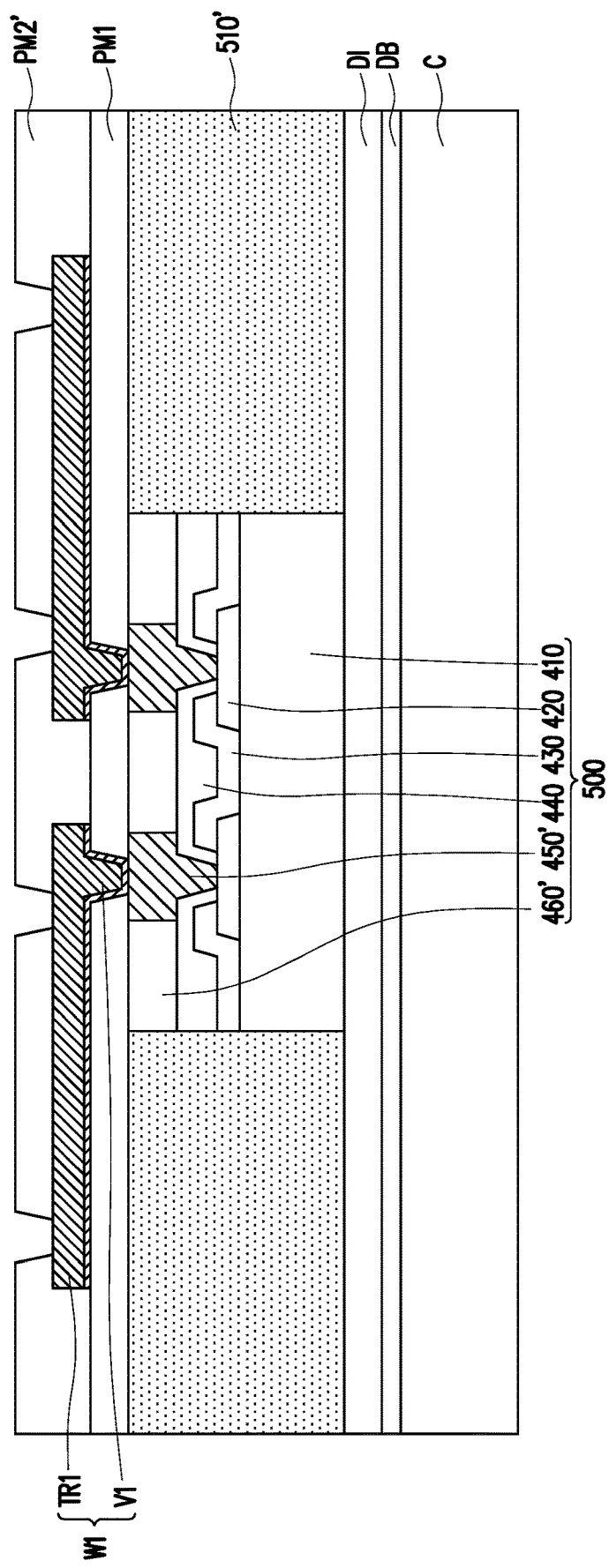
Figure 3L:
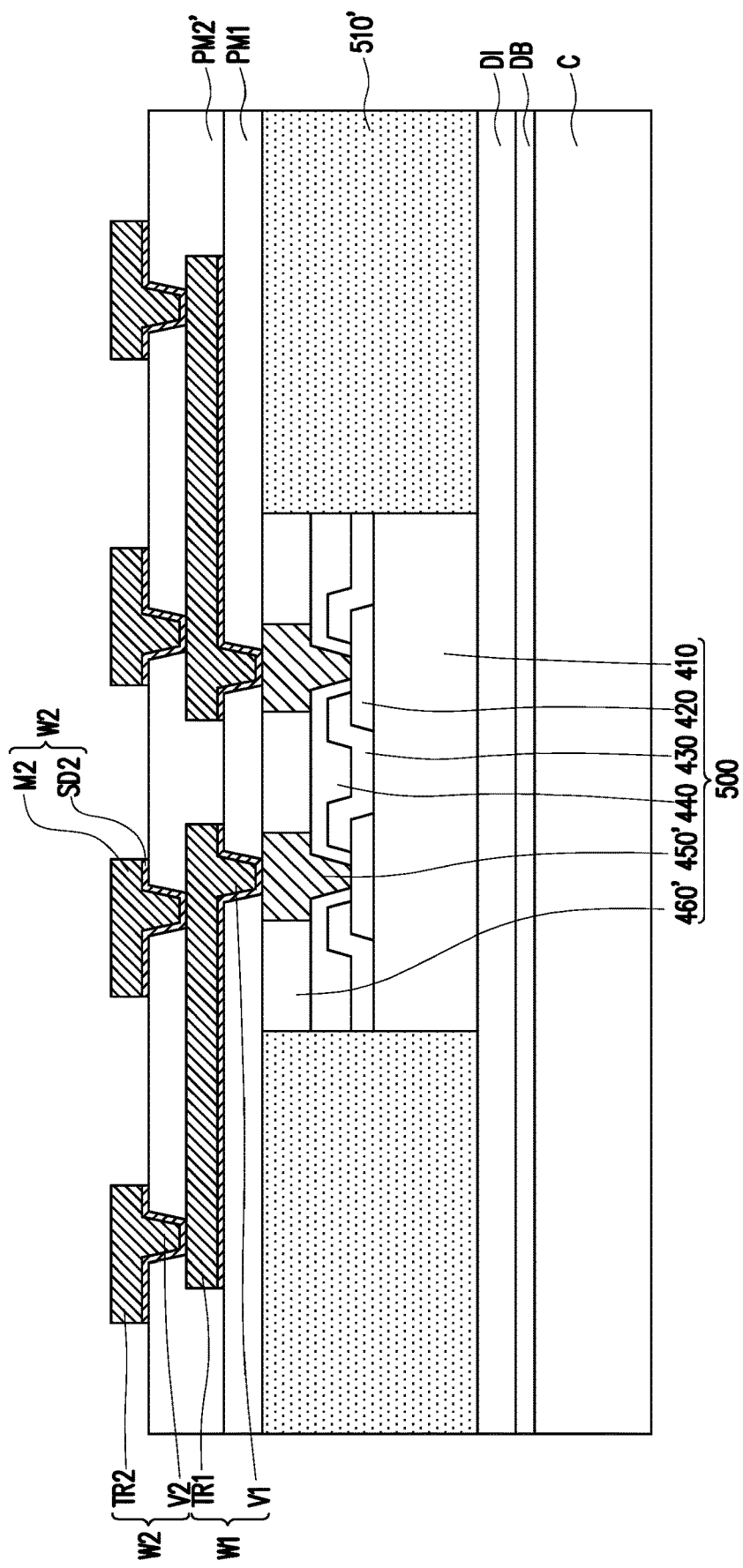
Figure 3M:
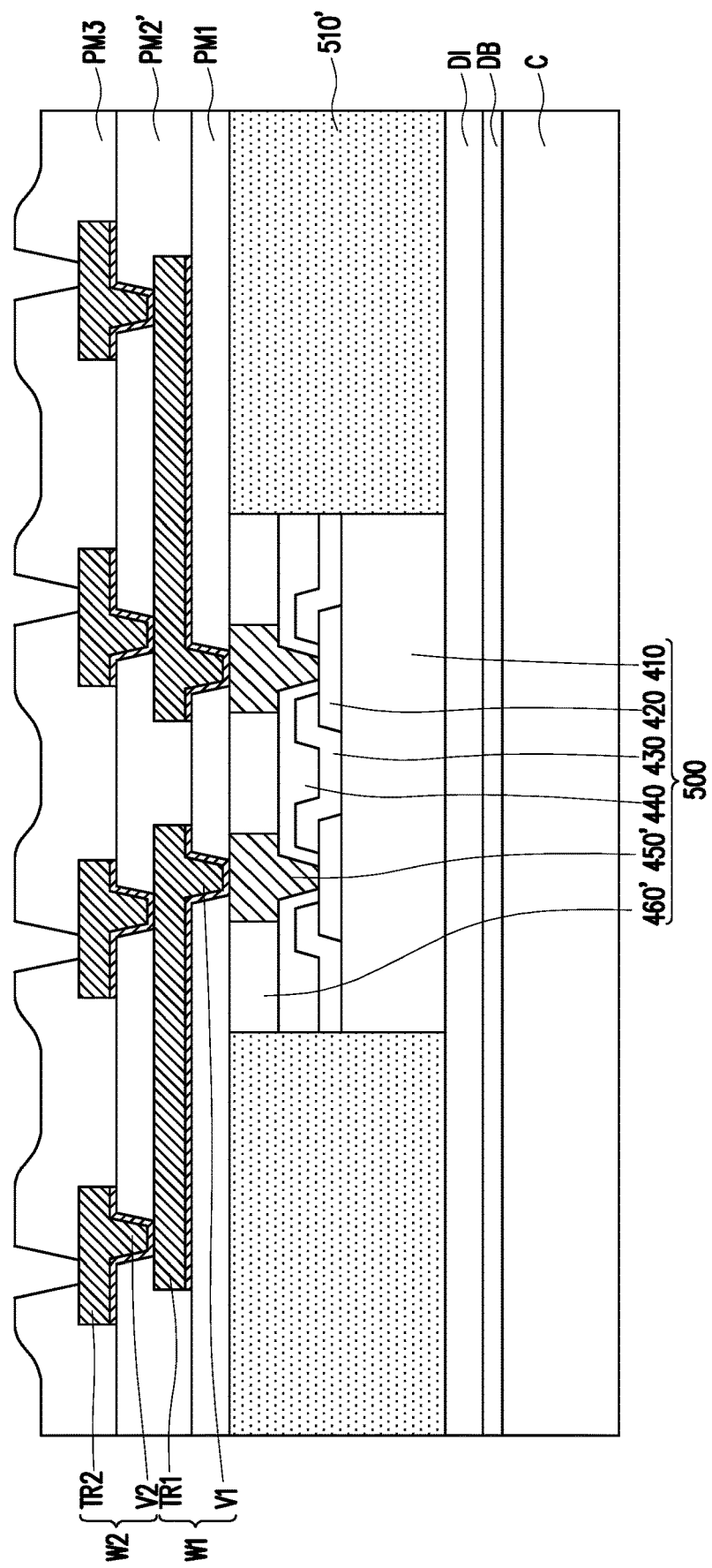
Figure 3N:
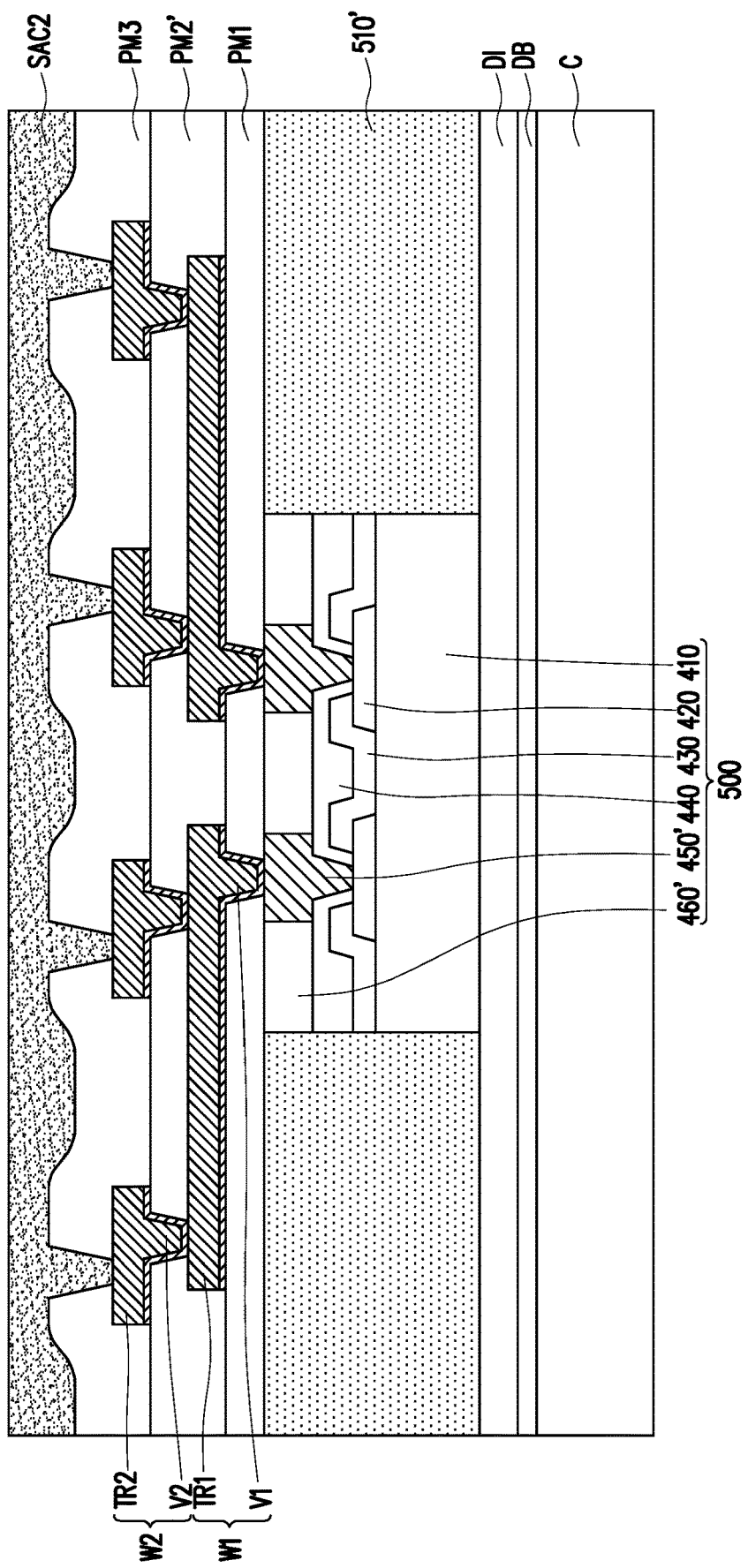
Figure 30:
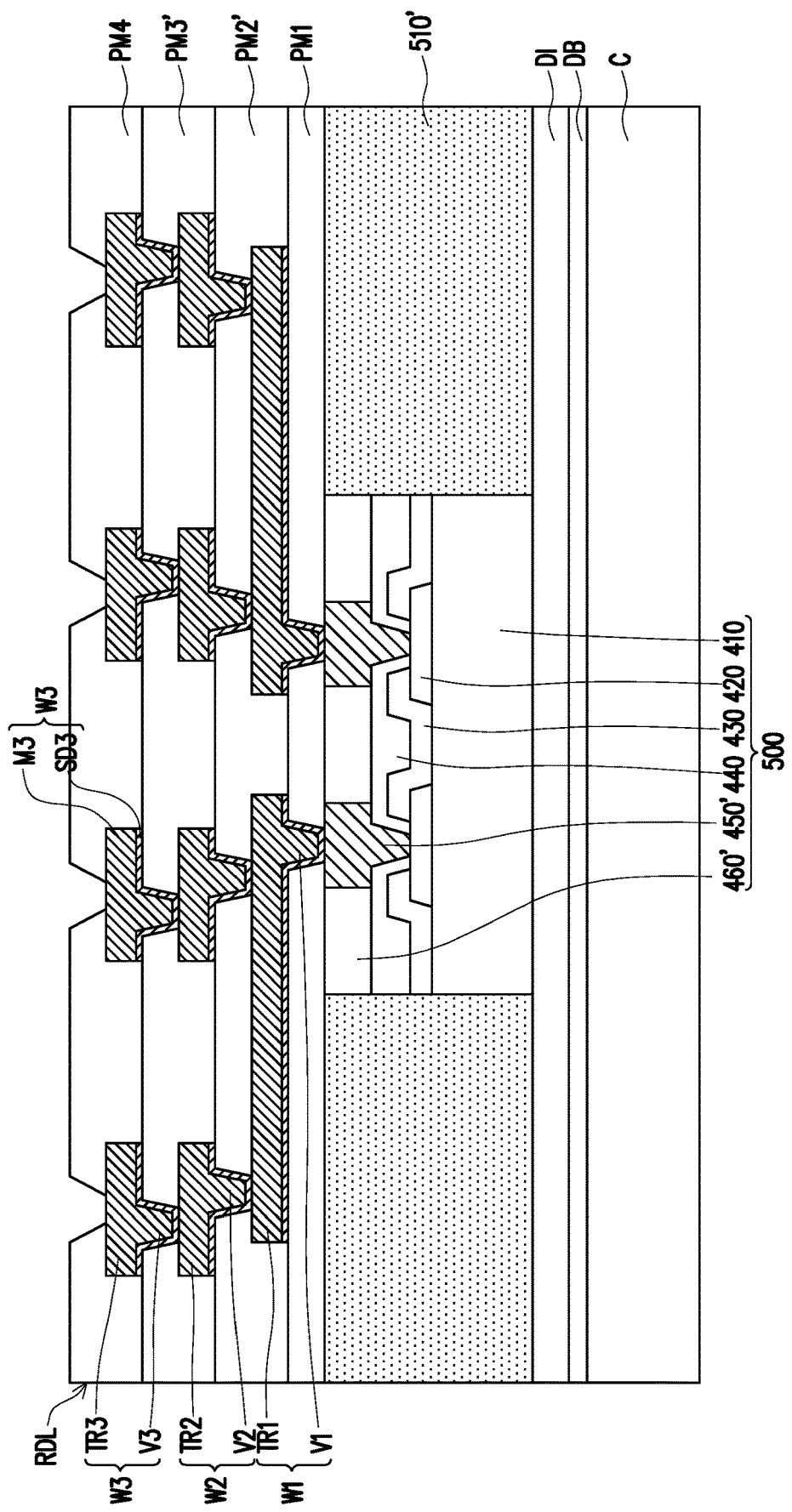
Figure 3P:
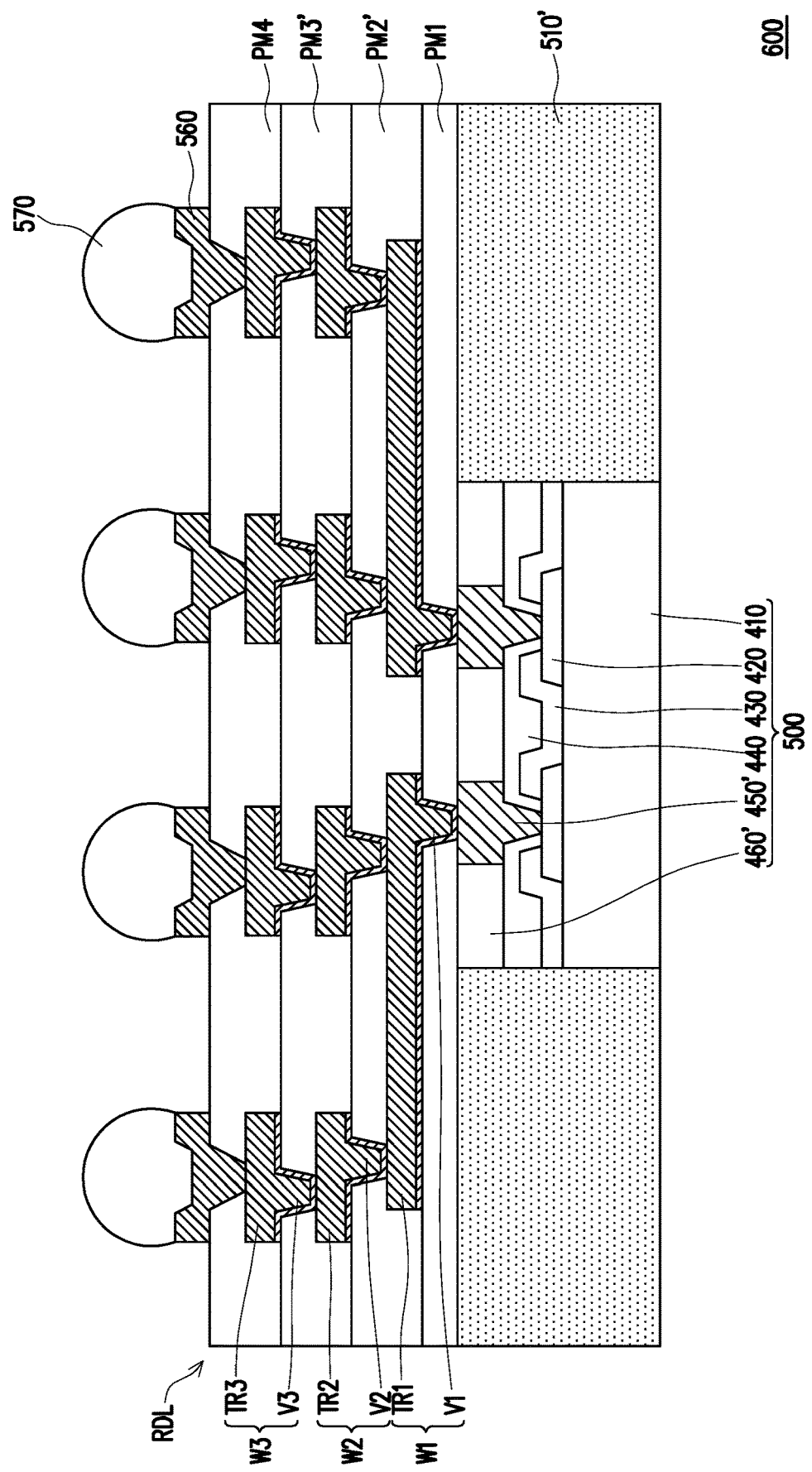
Figure 3Q:
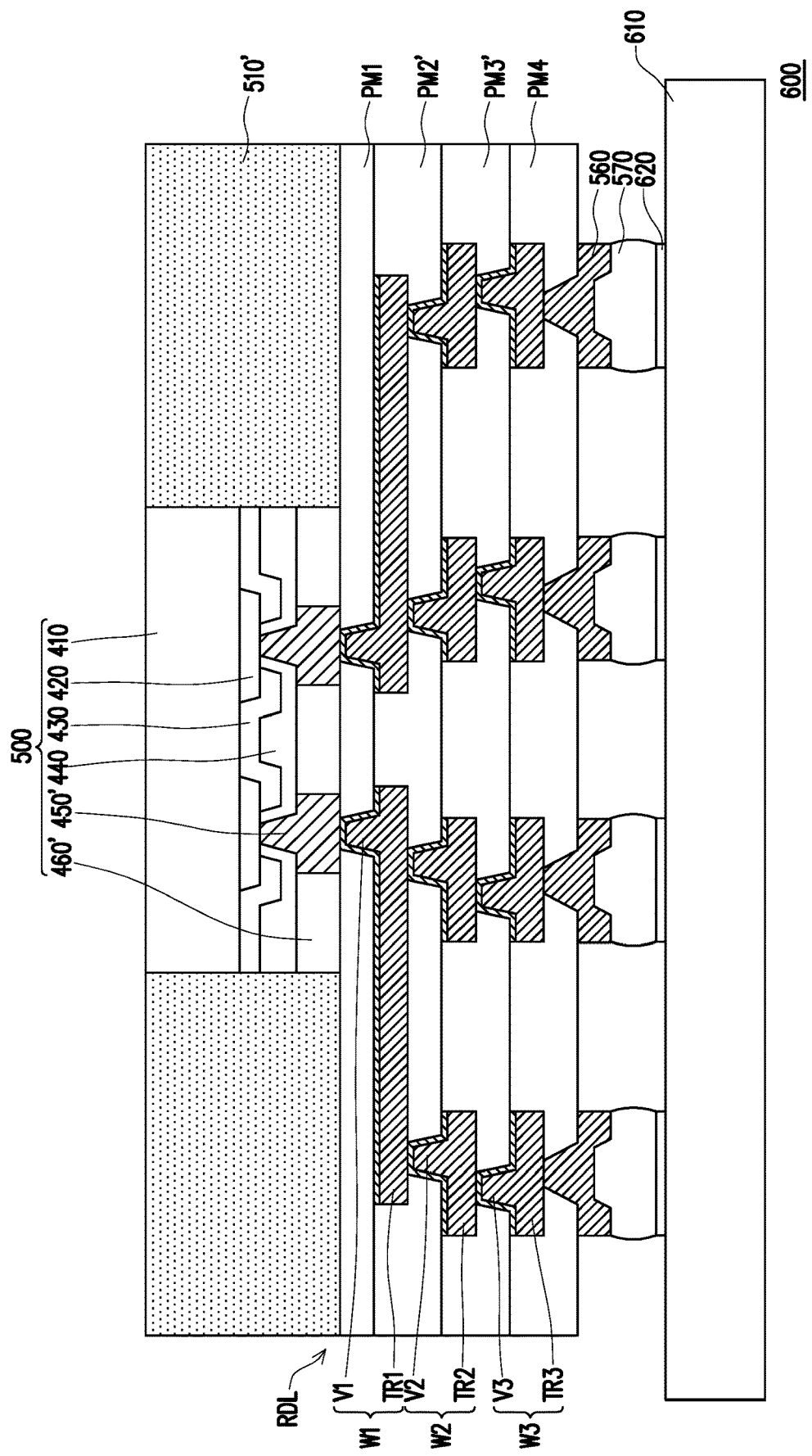

FIGS. 3A through 3Q illustrate a process flow for fabricating an integrated fan-out package in accordance with some embodiments. The difference between the embodiments described in FIGS. 1A-1Q and the embodiments described in FIGS. 3A-3Q lies on the shape of conductive wirings of the redistribution circuit structure RDL such that different forming processes are required.

Referring to FIG. 3A, a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example.

Referring to FIG. 3B, after the carrier C having the de-bonding layer DB and the dielectric layer DI formed thereon is provided, a semiconductor die 500 is picked and placed on the dielectric layer DI. In some embodiments, the semiconductor die 500 may include a semiconductor substrate 410, a plurality of conductive pads 420 formed on the semiconductor substrate 410, a passivation layer 430 and a post-passivation layer 440 formed over the semiconductor substrate 410, a plurality of conductive pillars 450 formed on the conductive pads 420, and a protection layer 460 formed on the post passivation layer 440 so as to cover the conductive pillars 450. For example, the semiconductor substrate 410 may be a silicon substrate including active components (e.g., transistors or the like) and passive components (e.g., resistors, capacitors, inductors or the like) formed therein and an interconnection structure formed on the silicon substrate; the conductive pads 420 may be aluminum pads, copper pads or other suitable metal pads; the passivation layer 430 may be a silicon oxide layer, a silicon nitride layer, a silicon oxy-nitride layer or a dielectric layer formed by other suitable dielectric materials; the post passivation layer 440 may be a polyimide (PI) layer, a polybenzoxazole (PBO) layer, or a dielectric layer formed by other suitable polymers; the conductive pillars 450 may be copper pillars or other suitable metal pillars; and the protection layer 460 may be a polybenzoxazole (PBO) layer, a polyimide (PI) layer or other suitable polymers.

As shown in FIG. 3B, in some embodiments, the semiconductor die 500 is attached or adhered on the dielectric layer DI through a die attach film (DAF) an adhesion paste or the like. In some alternative embodiments, more than one of the semiconductor dies 500 are picked and placed on the dielectric layer DI, wherein the semiconductor dies 500 placed on the dielectric layer DI may be arranged in an array.

Pluralities of conductive posts (not shown in FIG. 3B) may be formed on the dielectric layer DI. In some embodiments, the conductive posts are formed on the dielectric layer DI through a plating process. In some alternative embodiments, the conductive posts are pre-formed by other process and then disposed on the dielectric layer DI through a pick-up and place process.

Referring to FIG. 3C, an insulating material 510 is formed on the dielectric layer DI to cover the semiconductor die 500. In some embodiments, the insulating material 510 is a molding compound formed by a molding process. As shown in FIG. 3C, the protection layer 460 of the semiconductor die 500 is covered by the insulating material 510. In other words, the protection layer 460 of the semiconductor die 500 is not revealed and is well protected by the insulating material 510. In some embodiments, the insulating material 510 includes epoxy or other suitable dielectric materials.

Referring to FIG. 3D, the insulating material 510 is then ground until top surfaces of the conductive pillars 450 and a top surface of the protection layer 460 are exposed. In some embodiments, the insulating material 510 is ground by a mechanical grinding process and/or a chemical mechanical polishing (CMP) process. After the insulating material 510 is ground, an insulating encapsulation 510' is formed over the dielectric layer DI to laterally encapsulate the semiconductor die 500. During the grinding process of the insulating material 410, portions of the protection layer 460 are ground to form a protection layer 460'.

As shown in FIG. 3D, the insulating encapsulation 510' encapsulates sidewalls of the semiconductor die 500. That is to say, the semiconductor die 500 is laterally encapsulated by the insulating encapsulant 510'. In other words, the semiconductor die 500 is embedded in the insulating encapsulant 510'. It is noted that, and top surfaces of the conductive pillars 450' and a top surface of the protection layer 460' are substantially coplanar with a top surface of the insulating encapsulant 510'.

Referring to FIG. 3E through FIG. 3P, after the insulating encapsulant 510' is formed, a redistribution circuit structure RDL electrically connected to the conductive pillars 450' of the semiconductor die 500 is formed on the top surface of the insulating encapsulant 510', the top surfaces of the conductive pillars 450, and the top surface of the protection layer 460'. The redistribution circuit structure RDL is fabricated to electrically connect with one or more connectors underneath. Here, the afore-said connectors may be the conductive pillars 450' of the semiconductor die 500. The redistribution circuit structure RDL is described in detail in the following discussion.

The following descriptions are focused on a manufacturing method of the redistribution circuit structure RDL in accordance with FIG. 3E through FIG. 3P.

Referring to FIG. 3E and FIG. 3F, a first dielectric material PM1 is formed on the insulating encapsulant 510' and the semiconductor die 500. In some embodiments, since the top surfaces of the conductive pillars 450' and the top surface of the protection layer 460' are substantially coplanar with the top surface of the insulating encapsulant 510', a surface topography of a top surface of the first dielectric material PM1 is substantially equal to surface topography of the top surfaces of the semiconductor die 500 and the insulating encapsulant 510'. In other words, a degree of planarization (DOP) of the top surface of the first dielectric material PM1 is substantially equal to degrees of planarization (DOP) of the top surfaces of the semiconductor die 500 and the insulating encapsulant 510'. In some embodiments, the first dielectric material PM1 may be a polymer including polyimide, PBO, BCB, Ajinomoto Buildup Film (ABF), Solder Resist film (SR), or the like. The first dielectric material PM1 may be formed by a suitable fabrication technique such as spin-coating, lamination, deposition, or the like.

As shown in FIG. 3E, after the first dielectric material PM1 is formed on the insulating encapsulant 510' and the semiconductor die 500, a first patterned photoresist PR1 is formed over the first dielectric material PM1, wherein the first patterned photoresist PR1 has a plurality of openings revealing portions of the first dielectric material PM1 that are located above and corresponding to the conductive pillars 450'. For example, the first patterned photoresist PR1 may be positive tone photoresist or negative tone photoresist, but the disclosure is not limited thereto. In some embodiments, the first patterned photoresist PR1 is patterned by photolithography process.

Thereafter, the portions of the first dielectric material PM1 revealed by the openings of the first patterned photoresist PR1 are removed by an etching process to form a first patterned dielectric material PM1 including a plurality of openings, wherein the openings of the first patterned dielectric material PM1 are tapered towards the top surface of the semiconductor die 500. As shown in FIG. 3F, after the first patterned dielectric material PM1 is formed, the first patterned photoresist PR1 is then stripped.

Referring to FIG. 3G, after the first patterned photoresist PR1 is stripped from the first patterned dielectric material PM1, a first seed layer SD1 is formed on the first patterned dielectric material PM1 to conformally cover the first patterned dielectric material PM1 and portions of the conductive pillars 450' revealed by the openings of the first patterned dielectric material PM1. That is to say, the first seed layer SD1 covers sidewalls and a top surface of the first patterned dielectric material PM1 and portions of the top surfaces of the conductive pillars 450'. In some embodiments, the first seed layer SD1 may be a copper seed layer, a titanium/copper (Ti/Cu) seed layer or other metal seed layers. A method of forming the first seed layer SD1 may use a physical vapor deposition (PVD) process (e.g., a sputtering process) or other suitable process, but the disclosure is not limited thereto.

Referring to FIG. 3H, after the first seed layer SD1 is formed on the first patterned dielectric material PM1, a second patterned photoresist (not shown) is formed over the first seed layer SD1, wherein the second patterned photoresist has a plurality of openings revealing portions of the first seed layer SD1 that are located above and corresponding to the conductive pillars 450'. For example, the second patterned photoresist may be positive tone photoresist or negative tone photoresist. In some embodiments, the second patterned photoresist is patterned by photolithography process.

Thereafter, a plurality of conductive layers M1 are plated on the first seed layer SD1 exposed by the openings of the second patterned photoresist. The plating process of the conductive layers M1 is described in detail as followings. For example, the carrier C including the semiconductor die 500, the insulating encapsulant 510', the first patterned dielectric material PM1, the first seed layer SD1, and the second patterned photoresist formed thereon may be immersed into a plating solution in a plating bath such that the conductive layers M1 are plated on the portions of the first seed layer SD1 revealed by the openings of the second patterned photoresist. After plating the conductive layers M1, the second patterned photoresist is stripped. Thereafter, by using the conductive layers M1 as a hard mask, portions of the first seed layer SD1 that are not covered by the conductive layers M1 may be removed through etching until the first patterned dielectric material PM1 are revealed, for example.

As shown in FIG. 3H, in some embodiments, portions of the conductive layers M1 and the underlying first seed layer SD1 formed on top surfaces of the first dielectric material PM1 may be referred to as traces TR1, and portions of the conductive layers M1 and the underlying first seed layer SD1 that fill the openings of the first patterned dielectric material PM1 may be referred to as vias V1. In some embodiments, since the vias V1 are formed in the openings of the first patterned dielectric material PM1, the vias V1 are tapered towards the top surface of the semiconductor die 500. In some embodiments, the traces TR1 and the vias V1 may be referred to as first conductive wirings W1, and the first conductive wirings W1 are electrically connected to the conductive pillars 450' of the semiconductor die 500. In some embodiments, the conductive layers M1 may include the copper, but the disclosure is not limited thereto.

Referring to FIG. 3I, after the first conductive wirings W1 are formed, a second patterned dielectric material PM2 is formed over the first patterned dielectric material PM1, wherein the second patterned dielectric material PM2 has a plurality of openings that are located above and corresponding to the first conductive wiring W1. That is to say, portions of the first conductive wiring W1 are revealed by the openings of the second patterned dielectric material PM2, wherein the openings of the second patterned dielectric material PM2 are tapered towards the top surface of the semiconductor die 500. In some embodiments, the second patterned dielectric material PM2 may be patterned using a third patterned photoresist (not shown) through the same process as the patterning process of the first patterned dielectric material PM1 discussed in FIGS. 3E and 3F above, and the description of the patterning process of the second patterned dielectric material PM2 is not repeated herein. In some embodiments, a thickness of the second patterned dielectric material PM2 is greater than a thickness of the traces TR1 of the first conductive wirings W1, for example. In some embodiments, a surface topography of a top surface of the second patterned dielectric material PM2 is higher than the surface topography of the top surface of the first patterned dielectric material PM1. That is to say, the top surface of the first patterned dielectric material PM1 is flatter than the top surface of the second patterned dielectric material PM2. In other words, a degree of planarization (DOP) of the top surface of the second patterned dielectric material PM2 is smaller than a degree of planarization (DOP) of the top surface of the first patterned dielectric material PM1. In some embodiments, the second patterned dielectric material PM2 may be a polymer including polyimide, PBO, BCB, Ajinomoto Buildup Film (ABF), Solder Resist film (SR), or the like. The second patterned dielectric material PM2 may be formed by a suitable fabrication technique such as spin-coating, lamination, deposition, or the like.

Referring to FIG. 3J, after the second patterned dielectric PM2 is formed over the first patterned dielectric material PM1, a first sacrificial layer SAC1 is formed on the second patterned dielectric material PM2 to cover the second patterned dielectric material PM2 and the portions of the first conductive wirings W1 revealed by the openings of the second patterned dielectric material PM2. That is, the first sacrificial layer SAC also fills the openings of the second patterned dielectric material PM2. In some embodiments, a thickness of the first sacrificial layer SAC1 is greater than the thickness of the second patterned dielectric material PM2, but the disclosure is not limited thereto. In some alternative embodiments, the thickness of the first sacrificial layer SAC1 may be substantially equal to the thickness of the second patterned dielectric material PM2, as long as the first sacrificial layer SAC1 can provide a required removal amount for subsequent removal process. In some embodiments, a surface topography of the top surface of the first sacrificial layer SAC1 is lower than the surface topography of the top surface of the second patterned dielectric material PM2. That is to say, the top surface of the first sacrificial layer SAC1 is flatter than the top surface of the second patterned dielectric material PM2. In other words, a degree of planarization (DOP) of the top surface of the first sacrificial layer SAC1 is greater than the degree of planarization (DOP) of the top surface of the second patterned dielectric material PM2. In some embodiments, a material of the first sacrificial layer SAC1 may include polymethylmethacrylate (PMMA), Novolac based photoresist, or the like. In some other embodiments, the material of the first sacrificial layer SAC1 may include polymer solution such as polyimide, epoxy, or the like having high viscosity such that the first sacrificial layer SAC1 may have non-conformal profile. The first sacrificial layer SAC1 may be formed by a suitable fabrication technique such as spin-coating, lamination, deposition, or the like.

Still referring to FIG. 3J, after the first sacrificial layer SAC1 is formed on the second dielectric material PM2, a removal process is then performed to remove the first sacrificial layer SAC1 and a portion of the second patterned dielectric material PM2 until a second patterned dielectric material PM2' is formed. During the removal process for removing the first sacrificial layer SAC1 and the portion of the second patterned dielectric material PM2, the thickness of the second patterned dielectric material PM2 is reduced to form the second patterned dielectric material PM2' having a flatter top surface. In some embodiments, portions of the first sacrificial layer SAC1 in the openings of the second patterned dielectric material PM2' are removed during the removal process for removing the first sacrificial layer SAC1 and the portions of the second patterned dielectric material PM2. In some alternative embodiments, after the removal process for removing the first sacrificial layer SAC1 and the portion of the second patterned dielectric material PM2, residues of the first sacrificial layer SAC1 remains in the openings of the second patterned dielectric material PM2' and are then removed by a cleaning process. In some embodiments, the removal process for removing the first sacrificial layer SAC1 and the portion of the second patterned dielectric material PM2 may include an anisotropic etch process such as a dry etch process. The removal process or the anisotropic etch process is performed through ion bombardment of a plasma. The plasma used in the removal process may include $O_2$ plasma, $CF_4$ plasma, $SF_6$ plasma, or combination thereof. Furthermore, due to etch selectivity of the first sacrificial layer SAC1 and the second dielectric material PM2, the first sacrificial layer SAC1 may be etched by the anisotropic etch process at a first etching rate and the second dielectric material PM2 may be etched by the anisotropic etch process at a second etching rate greater than the first etching rate such that the second dielectric material PM2' may have a flatter top surface. For example, the first etching rate may range from about 0.05 um/min to about 2.5 um/min, and the second etching rate may range from about 0.05 um/min to about 2.5 um/min.

Referring to FIG. 3K, after the removal process is performed, the second patterned dielectric material PM2' is formed and the portions of the first conductive wirings W1 are revealed by the openings of the second patterned dielectric material PM2'. In some embodiments, after the removal process, the surface topography of the top surface of the second patterned dielectric material PM2' (shown in FIG. 3K) is lower than the surface topography of the top surface of the second patterned dielectric material PM2 (shown in FIGS. 3I and 3J). In other words, the removal process utilizing the first sacrificial layer SAC1 increases the degree of planarization (DOP) of the top surface of the second patterned dielectric material PM2. After the removal process, the degree of planarization (DOP) of the top surface of the second patterned dielectric material PM2' may range from about 0.93 to about 0.96.

Referring to FIG. 3L, after the second patterned dielectric material PM2' is formed, a second seed layer SD2 is formed on the second patterned dielectric material PM2' to conformally cover the second patterned dielectric material PM2' and the portions of the first conductive wirings W1 revealed by the openings of the second patterned dielectric material PM2'. That is to say, the second seed layer SD2 covers sidewalls and a top surface of the second patterned dielectric material PM2' and portions of the top surfaces of the first conductive wirings W1. In some embodiments, the second seed layer SD2 may be a copper seed layer, a titanium/copper (Ti/Cu) seed layer or other metal seed layers. A method of forming the first seed layer SD1 may use a physical vapor deposition (PVD) process (e.g., a sputtering process) or other suitable process, but the disclosure is not limited thereto.

Still referring to FIG. 3L, after the second seed layer SD2 is formed on the second patterned dielectric material PM2', a fourth patterned photoresist (not shown) is formed over the second seed layer SD2, wherein the fourth patterned photoresist has a plurality of openings revealing portions of the second seed layer SD2 that are located above and corresponding to the first conductive wiring W1. For example, the fourth patterned photoresist may be positive tone photoresist or negative tone photoresist. In some embodiments, the fourth patterned photoresist is patterned by photolithography process.

Thereafter, a plurality of conductive layers M2 are plated on the second seed layer SD2. The plating process of the conductive layers M2 is described in detail as followings. For example, the carrier C including the above-mentioned structures and the fourth patterned photoresist formed thereon may be immersed into a plating solution in a plating bath such that the conductive layers M2 are plated on the portions of the second seed layer SD2 revealed by the openings of the fourth patterned photoresist. After plating the conductive layers M2, the fourth patterned photoresist is stripped. Thereafter, by using the conductive layers M2 as a hard mask, portions of the second seed layer SD2 that are not covered by the conductive layers M2 may be removed through etching until the second patterned dielectric material PM2' are revealed, for example.

As shown in FIG. 3L, in some embodiments, portions of the conductive layers M2 and the underlying second seed layer SD2 formed on top surfaces of the second patterned dielectric material PM2' may be referred to as traces TR2, and portions of the conductive layers M2 and the underlying second seed layer SD2 that fill the openings of the second patterned dielectric material PM2' may be referred to as vias V2. In some embodiments, since the vias V2 are formed in the openings of the second patterned dielectric material PM2', the vias V2 are tapered towards the top surface of the semiconductor die 500. In some embodiments, the traces TR2 and the vias V2 may be referred to as second conductive wirings W2, and the second conductive wirings W2 are electrically connected to the first conductive wirings W1. In some embodiments, the conductive layers M2 may include copper, but the disclosure is not limited thereto.

Referring to FIG. 3M, after the second conductive wirings W2 are formed, a third dielectric material PM3 is formed over the second patterned dielectric material PM2', wherein the third dielectric material PM3 has a plurality of openings that are located above and corresponding to the second conductive wiring W2. That is to say, portions of the second conductive wirings W2 are revealed by the openings of the third dielectric material PM3, wherein the openings of the third dielectric material PM3 are tapered towards the top surface of the semiconductor die 500. In some embodiments, the third dielectric material PM3 may be patterned using a fifth patterned photoresist (not shown) through the same process as the patterning process of the first patterned dielectric material PM1 discussed in FIGS. 3E and 3F above, and the description of the patterning process of the third dielectric material PM3 is not repeated herein. In some embodiments, a thickness of the third patterned dielectric material PM3 is greater than a thickness of the traces TR2 of the second conductive wirings W2, for example. In some embodiments, a surface topography of a top surface of the third patterned dielectric material PM3 is higher than the surface topography of the top surface of the second patterned dielectric material PM2'. That is to say, the top surface of the second patterned dielectric material PM2' is flatter than the top surface of the third patterned dielectric material PM3. In other words, a degree of planarization (DOP) of the top surface of the third patterned dielectric material PM3 is smaller than a degree of planarization (DOP) of the top surface of the second patterned dielectric material PM2'. In some embodiments, the third patterned dielectric material PM3 may be a polymer including polyimide, PBO, BCB, Ajinomoto Buildup Film (ABF), Solder Resist film (SR), or the like. The third patterned dielectric material PM3 may be formed by a suitable fabrication technique such as spin-coating, lamination, deposition, or the like.

Referring to FIG. 3N, after the third patterned dielectric material PM3 is formed over the second patterned dielectric material PM2', a second sacrificial layer SAC2 is formed on the third patterned dielectric material PM3 to cover the third patterned dielectric material PM3 and the portions of the second conductive wirings W2 revealed by the openings of the third patterned dielectric material PM3. That is, the second sacrificial layer SAC2 also fills the openings of the third patterned dielectric material PM3. In some embodiments, a thickness of the second sacrificial layer SAC2 is greater than the thickness of the third patterned dielectric material PM3, but the disclosure is not limited thereto. In some alternative embodiments, the thickness of the second sacrificial layer SAC2 may be substantially equal to the thickness of the third patterned dielectric material PM3, as long as the second sacrificial layer SAC2 can provide a required removal amount for subsequent removal process. In some embodiments, a surface topography of the top surface of the second sacrificial layer SAC2 is lower than the surface topography of the top surface of the third patterned dielectric material PM3. That is to say, the top surface of the second sacrificial layer SAC2 is flatter than the top surface of the third patterned dielectric material PM3. In other words, a degree of planarization (DOP) of the top surface of the second sacrificial layer SAC2 is greater than the degree of planarization (DOP) of the top surface of the third patterned dielectric material PM3. In some embodiments, a material of the second sacrificial layer SAC2 may include polymethylmethacrylate (PMMA), Novolac based photoresist, or the like. In some other embodiments, the material of the first sacrificial layer SAC1 may include polymer solution such as polyimide, epoxy, or the like having high viscosity such that the first sacrificial layer SAC1 may have non-conformal profile. The second sacrificial layer SAC2 may be formed by a suitable fabrication technique such as spin-coating, lamination, deposition, or the like.

Still referring to FIG. 3N, after the second sacrificial layer SAC2 is formed on the third patterned dielectric material PM3, a removal process is then performed to remove the second sacrificial layer SAC2 and a portion of the third patterned dielectric material PM3 until a third patterned dielectric material PM3' is formed. During the removal process for removing the second sacrificial layer SAC2 and the portion of the third patterned dielectric material PM3, the thickness of the third patterned dielectric material PM3 is reduced to form the third patterned dielectric material PM3' having a flatter top surface. In some embodiments, portions of the second sacrificial layer SAC2 in the openings of the third patterned dielectric material PM3' are removed during the removal process for removing the second sacrificial layer SAC2 and the portions of the third patterned dielectric material PM3. In some embodiments, after the removal process for removing the second sacrificial layer SAC2 and the portions of the second patterned dielectric material PM3, residues of the second sacrificial layer SAC2 remains in the openings of the third patterned dielectric material PM3' and are then removed by a cleaning process. In some embodiments, the removal process for removing the second sacrificial layer SAC2 and the portions of the second patterned dielectric material PM3 may include an anisotropic etch process such as a dry etch process. The removal process or the anisotropic etch process is performed through ion bombardment of a plasma. The plasma used in the removal process may include $O_2$ plasma, $CF_4$ plasma, $SF_6$ plasma, or combination thereof. Furthermore, due to etch selectivity of the second sacrificial layer SAC2 and the third dielectric material PM3, the second sacrificial layer SAC2 may be etched by the anisotropic etch process at a first etching rate and the third dielectric material PM3 may be etched by the anisotropic etch process at a second etching rate greater than the first etching rate such that the third dielectric material PM3' may have a flatter top surface. For example, the first etching rate may range from about 0.05 um/min to about 2.5 um/min, and the second etching rate may range from about 0.05 um/min to about 2.5 um/min.

Referring to FIG. 3O, after the removal process is performed, the third patterned dielectric material PM3' is formed and the portions of the second conductive wiring W2 are revealed by the openings of the third patterned dielectric material PM3'. In some embodiments, after the removal process, the surface topography of the top surface of the third patterned dielectric material PM3' (shown in FIG. 3O) is lower than the surface topography of the top surface of the third patterned dielectric material PM3 (shown in FIGS. 3M and 3N). In other words, the removal process utilizing the second sacrificial layer SAC2 increases the degree of planarization (DOP) of the top surface of the third patterned dielectric material PM3. After the removal process, the degree of planarization (DOP) of the top surface of the third patterned dielectric material PM3' may range from about 0.93 to about 0.96.

Referring to FIG. 3O, in some embodiments, the above-mentioned steps as illustrated in FIG. 3E through FIG. 3N may be performed multiple times to fabricate a multi-layered redistribution circuit layer as required by the circuit design. In other words, the redistribution circuit structure RDL may include a plurality of conductive wirings and a plurality of dielectric layers stacked alternately. For example, a third conductive wirings W3 having vias V3 and traces TR3 including a third seed layer SD3 and a plurality of conductive layers M3 are formed on the second conductive wirings W2, wherein the third conductive wiring W3 are in physical and electrical contacts with the second conductive wirings W2. As such, the manufacturing method of the redistribution circuit structure RDL is substantially completed.

As shown in FIG. 3O, in some embodiments, a fourth patterned dielectric material PM4 is formed on the redistribution circuit structure RDL, wherein the fourth patterned dielectric material PM4 has a plurality of openings revealing portions of a topmost conductive wirings (the conductive wirings W3, for example) of the redistribution structure RDL. In some embodiments, the fourth patterned dielectric material PM4 may be referred to as a patterned passivation layer. In some embodiments, the fourth patterned dielectric material PM4 may be a polymer including polyimide, PBO, BCB, Ajinomoto Buildup Film (ABF), Solder Resist film (SR), or the like. The fourth patterned dielectric material PM4 may be formed by a suitable fabrication technique such as spin-coating, lamination, deposition, or the like.

As shown in FIG. 3P, a plurality of pads 560 are formed on the portions of the topmost conductive wirings W3 of the redistribution circuit structure RDL revealed by the openings of the fourth patterned dielectric material PM4. In some embodiments, the pads 560 may be an under-ball metallurgy (UBM), but the disclosure is not limited thereto. In some alternative embodiments, the pads 560 may include the under-ball metallurgy (UBM) patterns for ball mount and connection pads for mounting of passive components (discussed in accordance with FIG. 4 later on). In some embodiments, the pads 560 also covers sidewalls of the of the openings and extends to partially cover the top surface of the passivation layer 550. The pads 560 are electrically connected to the topmost conductive wiring W3 of the redistribution circuit structure RDL through the openings of the fourth patterned dielectric material PM4. In other words, the pads 560 are electrically connected to the conductive pillars 450 of the semiconductor die 500 through the redistribution circuit structure RDL. It is noted that the number of the pads 560 is not limited in the disclosure. As shown in FIG. 3P, after the pads 560 are formed, a plurality of conductive balls 570 are placed on the pads 560. The conductive balls 570 may include copper, aluminum, lead-free alloys (e.g., gold, tin, silver, aluminum, or copper alloys) or lead alloys (e.g., lead-tin alloys). In some embodiments, the conductive balls 570 are placed on the pads 560 by a ball placement process. As such, after conductive balls 570 are placed on the pads 560, the integrated fan-out package 600 is substantially formed.

Figure 4:
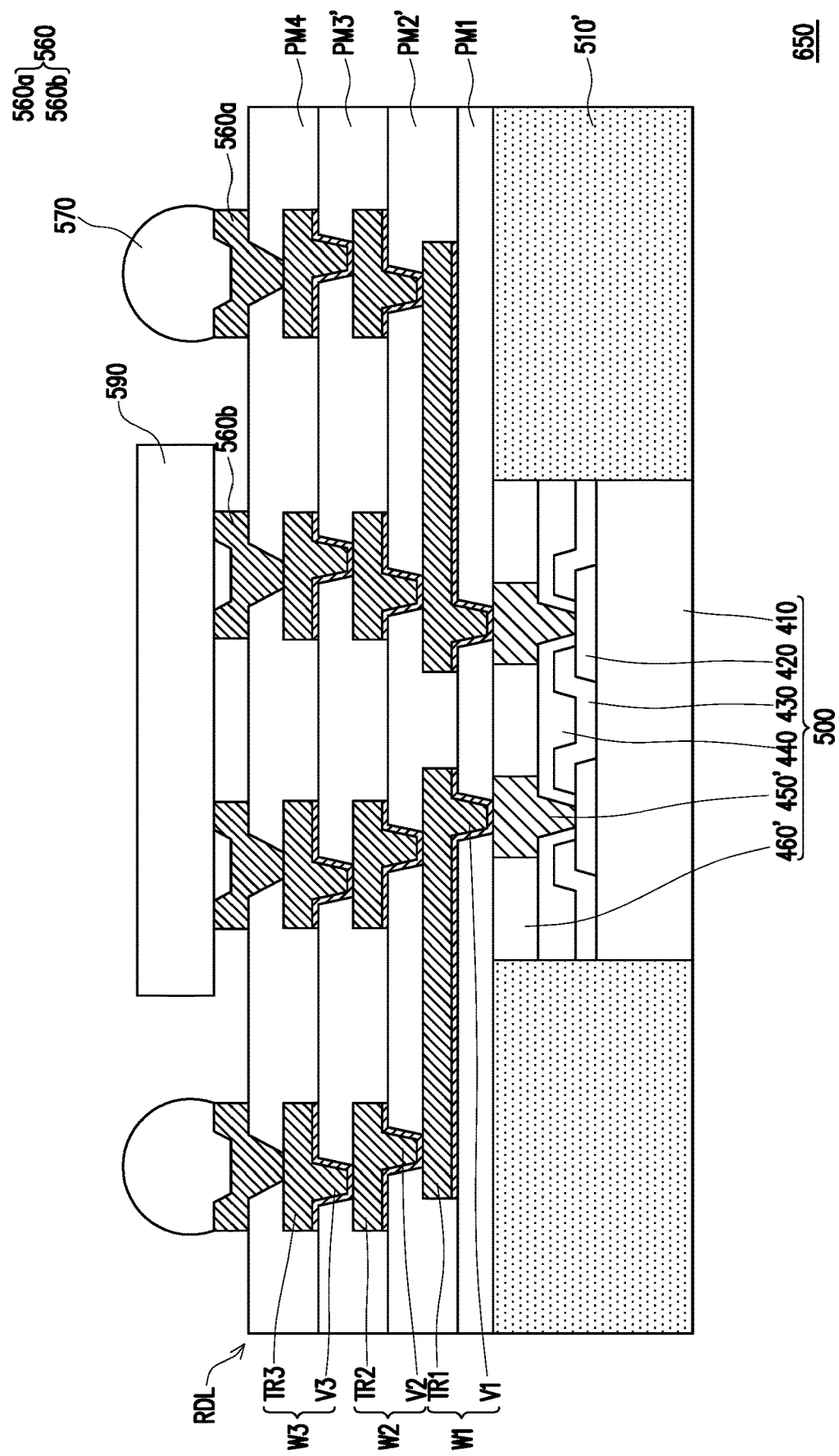
FIG. 4 is a cross-sectional view illustrating an integrated fan-out package in accordance with some alternative embodiments.

FIG. 4 is a cross-sectional view illustrating an integrated fan-out package 650 in accordance with some alternative embodiments. Referring to FIG. 3P and FIG. 4, the integrated fan-out package 650 as illustrated in FIG. 4 is similar to the integrated fan-out package 600 as illustrated in FIG. 3P except that the pads 560 may include under-ball metallurgy (UBM) patterns 560a for ball mount and connection pads 560b for mounting of passive components.

As shown in FIG. 4, after the UBM patterns 560a and the connection pads 560b are formed, a plurality of conductive balls 570 are placed on the under-ball metallurgy patterns 560a and a plurality of passive components 590 are mounted on the connection pads 560b. In some embodiments, the conductive balls 570 may be placed on the under-ball metallurgy patterns 560a by a ball placement process, and the passive components 590 may be mounted on the connection pads 560b through a solder or reflow process. In some embodiments, a height of the conductive balls 570 is greater than a height of the passive components 590. In some embodiments, the passive components 590 include resistors, capacitors, inductors or the like.

Referring back to FIG. 3P, a de-bonding process is performed such that the integrated fan-out package 600 with or without the dielectric layer DI is de-bonded from the de-bonding layer DB and the carrier C (not shown for brevity). In some embodiments, the de-bonding layer DB (e.g., the LTHC release layer) may be irradiated by an UV laser such that the integrated fan-out package 600 is de-bonded from the carrier C. In some embodiments, the dielectric layer DI may be ground to reveal the bottom surface of the insulating encapsulant 510' when the integrated fan-out package 600 includes the dielectric layer DI, but the disclosure is not limited thereto. In some alternative embodiments, the dielectric layer DI may be patterned when conductive posts are included in the integrated fan-out package 600 such that a plurality of contact openings (not shown) is formed in the dielectric layer DI to reveal the conductive posts (not shown) embedded in the insulating encapsulant 510'.

Referring to FIG. 3Q, after performing the de-bonding process, the integrated fan-out package 600 de-bonded from the carrier C may be flipped (turned upside down) and mounted onto a printed circuit board (PCB) 610 including pads formed thereon such that the conductive balls 570 are mounted on and electrically connected to the printed circuit board (PCB) 610 through the pads 620.

Based on above, the above-mentioned removal process utilizing the sacrificial layers increases the degree of planarization (DOP) of the dielectric layers in the redistribution circuit structure RDL, wherein after the removal process, the degree of planarization (DOP) of the dielectric layers may range from about 0.93 to about 0.96. As such, a topographical issue of dielectric layers in a redistribution circuit structure can be overcome.

In accordance with some embodiments of the present disclosure, a method of fabricating an integrated fan-out package including the following steps is provided. A semiconductor die is laterally encapsulated by an insulating encapsulant. A redistribution circuit structure is formed on the insulating encapsulant and the semiconductor die, and the redistribution circuit structure is electrically connected to the semiconductor die. A forming method of the redistribution circuit structure includes the following steps. A conductive wiring is formed over the insulating encapsulant and the semiconductor die. A dielectric material is formed on the insulating encapsulant and the semiconductor die to cover the conductive wiring. A sacrificial layer is formed on the dielectric material, wherein a first top surface of the sacrificial layer is flatter than a second top surface of the dielectric material. The sacrificial layer and a portion of the dielectric material are removed until the conductive wiring is revealed to form a dielectric layer, wherein the conductive wiring is embedded in the dielectric layer.

In accordance with some embodiments of the present disclosure, a method of fabricating an integrated fan-out package including the following steps is provided. A semiconductor die is laterally encapsulated by an insulating encapsulant. A redistribution circuit structure is formed on the insulating encapsulant and the semiconductor die. The redistribution circuit structure is electrically connected to the semiconductor die and includes at least one conductive wiring and a plurality of dielectric layers stacked alternately. A forming method of at least one dielectric layer of the plurality of the dielectric layers of the redistribution circuit structure includes the following steps. A dielectric material is formed. A sacrificial layer is formed on the dielectric material. The sacrificial layer and a portion of the dielectric material are anisotropically removed to reduce a degree of planarization of the dielectric material.

In accordance with some embodiments of the present disclosure, a method of fabricating an integrated fan-out package including the following steps is provided. A semiconductor die is laterally encapsulated by an insulating encapsulant. A redistribution circuit structure is formed on the insulating encapsulant and the semiconductor die, and the redistribution circuit structure is electrically connected to the semiconductor die. The redistribution circuit structure includes at least one conductive wiring and a plurality of dielectric layers stacked alternately. A forming method of at least one dielectric layer of the plurality of the dielectric layers of the redistribution circuit structure includes the followings steps. A dielectric material is formed. A photoresist layer is formed to entirely cover the dielectric material, wherein a first degree of planarization of the photoresist layer is smaller than a second degree of planarization of the dielectric material. An anisotropic etching is performed to remove the photoresist layer and a portion of the dielectric material to reduce the second degree of planarization of the dielectric material.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of fabricating an integrated fan-out package, comprising:
   laterally encapsulating a semiconductor die with an insulating encapsulant;
   forming a redistribution circuit structure on the insulating encapsulant and the semiconductor die, the redistribution circuit structure being electrically connected to the semiconductor die, and forming the redistribution circuit structure comprising:
      forming a conductive wiring over the insulating encapsulant and the semiconductor die;
      forming a dielectric material on the insulating encapsulant and the semiconductor die to cover the conductive wiring;
      forming a sacrificial layer on the dielectric material, wherein a first top surface of the sacrificial layer is flatter than a second top surface of the dielectric material; and
      removing the sacrificial layer and a portion of the dielectric material until the conductive wiring is revealed to form a dielectric layer, wherein the conductive wiring is embedded in the dielectric layer.

2. The method as claimed in claim 1, wherein the sacrificial layer and the portion of the dielectric material are removed through an anisotropic etch process until the conductive wiring is revealed.

3. The method as claimed in claim 2, wherein the anisotropic etch process comprises a dry etch process.

4. The method as claimed in claim 2, wherein the anisotropic etch process is performed by ion bombardment of a plasma.

5. The method as claimed in claim 4, wherein the plasma comprises $O_2$ plasma, $CF_4$ plasma, $SF_6$ plasma, or a combination thereof.

6. The method as claimed in claim 1, wherein a first degree of planarization of the first top surface is smaller than a second degree of planarization of the second top surface before removing the sacrificial layer and the portion of the dielectric material.

7. The method as claimed in claim 1, wherein a first surface topography of the first top surface is lower than a second surface topography of the second top surface before removing the sacrificial layer and the portion of the dielectric material.

8. The method as claimed in claim 1, wherein a third degree of planarization of the dielectric layer ranges from about 0.93 to about 0.96.

9. A method of fabricating an integrated fan-out package, comprising:
  laterally encapsulating a semiconductor die with an insulating encapsulant;
  forming a redistribution circuit structure on the insulating encapsulant and the semiconductor die, the redistribution circuit structure being electrically connected to the semiconductor die and comprising at least one conductive wiring and a plurality of dielectric layers stacked alternately, and forming at least one dielectric layer of the plurality of the dielectric layers of the redistribution circuit structure comprising:
    forming a dielectric material;
    forming a sacrificial layer on the dielectric material; and
    anisotropically removing the sacrificial layer and a portion of the dielectric material to reduce a degree of planarization of the dielectric material.

10. The method as claimed in claim 9, wherein the sacrificial layer and the portion of the dielectric material are removed through an anisotropic etch process until the conductive wiring is revealed.

11. The method as claimed in claim 10, wherein the anisotropic etch process comprises a dry etch process.

12. The method as claimed in claim 10, wherein the anisotropic etch process is performed by ion bombardment of a plasma.

13. The method as claimed in claim 12, wherein the plasma includes $O_2$ plasma, $CF_4$ plasma, $SF_6$ plasma, or a combination thereof.

14. The method as claimed in claim 9, wherein a first top surface of the sacrificial layer is flatter than a second top surface of the dielectric material.

15. The method as claimed in claim 9, wherein the degree of planarization of the at least one dielectric layer ranges from about 0.93 to about 0.96.

16. The method as claimed in claim 9, wherein the at least one dielectric layer is formed directly on the insulating encapsulant and the semiconductor die.

17. The method as claimed in claim 9, wherein the at least one dielectric layer is formed on the conductive wiring.

18. A method of fabricating an integrated fan-out package, comprising:
  laterally encapsulating a semiconductor die with an insulating encapsulant;
  forming a redistribution circuit structure on the insulating encapsulant and the semiconductor die, the redistribution circuit structure being electrically connected to the semiconductor die and comprising at least one conductive wiring and a plurality of dielectric layers stacked alternately, and forming at least on dielectric layer of the plurality of dielectric layers of the redistribution circuit structure comprising:
    forming a dielectric material;
    forming a photoresist layer entirely covering the dielectric material, wherein a first degree of planarization of the photoresist layer is smaller than a second degree of planarization of the dielectric material; and
    performing an anisotropic etching to remove the photoresist layer and a portion of the dielectric material to reduce the second degree of planarization of the dielectric material.

19. The method as claimed in claim 18, wherein the sacrificial layer and the portion of the dielectric material is removed by ion bombardment of a plasma.

20. The method as claimed in claim 18, wherein the degree of planarization of the at least one dielectric layer ranges from about 0.93 to about 0.96.

* * * * *